United States Patent
Nitta et al.

(10) Patent No.: US 10,134,586 B2
(45) Date of Patent: Nov. 20, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takafumi Nitta, Toyama (JP); Satoshi Shimamoto, Toyama (JP); Yoshiro Hirose, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 39 days.

(21) Appl. No.: 14/845,985

(22) Filed: Sep. 4, 2015

(65) Prior Publication Data

US 2016/0071720 A1 Mar. 10, 2016

(30) Foreign Application Priority Data

Sep. 8, 2014 (JP) ................. 2014-182437

(51) Int. Cl.
| | | |
|---|---|---|
| C23C 16/00 | (2006.01) | |
| H01L 21/02 | (2006.01) | |
| C23C 16/40 | (2006.01) | |
| C23C 16/455 | (2006.01) | |

(52) U.S. Cl.
CPC ........ *H01L 21/0228* (2013.01); *C23C 16/401* (2013.01); *C23C 16/45527* (2013.01); *C23C 16/45536* (2013.01); *C23C 16/45546* (2013.01); *H01L 21/02126* (2013.01); *H01L 21/02164* (2013.01)

(58) Field of Classification Search
CPC ............ C23C 16/401; C23C 16/45527; C23C 16/45536; C23C 16/45546
See application file for complete search history.

(56) References Cited

U.S. PATENT DOCUMENTS

| | | | |
|---|---|---|---|
| 2006/0160376 A1 | 7/2006 | Padhi et al. | |
| 2006/0205143 A1* | 9/2006 | Govindarajan | ..... H01L 27/1087 438/240 |
| 2006/0228903 A1 | 10/2006 | Mcswiney et al. | |
| 2006/0284246 A1* | 12/2006 | Forbes | ................ G11C 11/5671 257/324 |
| 2008/0017954 A1 | 1/2008 | Suzuki et al. | |

(Continued)

FOREIGN PATENT DOCUMENTS

| | | |
|---|---|---|
| JP | 2008-028249 A | 2/2008 |
| JP | 2010-267925 A | 11/2010 |

(Continued)

OTHER PUBLICATIONS

Japanese Office Action dated Mar. 6, 2018 for the Japanese Patent Application No. 2014-182437.

*Primary Examiner* — Kelly M Gambetta
(74) *Attorney, Agent, or Firm* — Volpe and Koenig, P.C.

(57) ABSTRACT

A technique includes forming a laminated film on a substrate by performing a cycle a predetermined number of times. The cycle includes forming a first film which contains at least a predetermined element and oxygen, and forming a second film which contains at least the predetermined element, oxygen and carbon. The first film and the second film are laminated to form the laminated film.

17 Claims, 12 Drawing Sheets

(56) References Cited

U.S. PATENT DOCUMENTS

| | | | |
|---|---|---|---|
| 2008/0251929 A1* | 10/2008 | Kageyama | H01L 21/76816 257/773 |
| 2010/0291763 A1 | 11/2010 | Ogawa et al. | |
| 2013/0084714 A1* | 4/2013 | Oka | H01L 21/02126 438/765 |
| 2014/0051261 A1 | 2/2014 | Ota et al. | |
| 2014/0342573 A1 | 11/2014 | Hirose et al. | |

FOREIGN PATENT DOCUMENTS

| | | |
|---|---|---|
| KR | 10-2007-0096035 A | 10/2007 |
| KR | 10-2012-0038577 A | 4/2012 |
| WO | 2012/128044 A1 | 9/2012 |
| WO | 2013/027549 A1 | 2/2013 |

\* cited by examiner

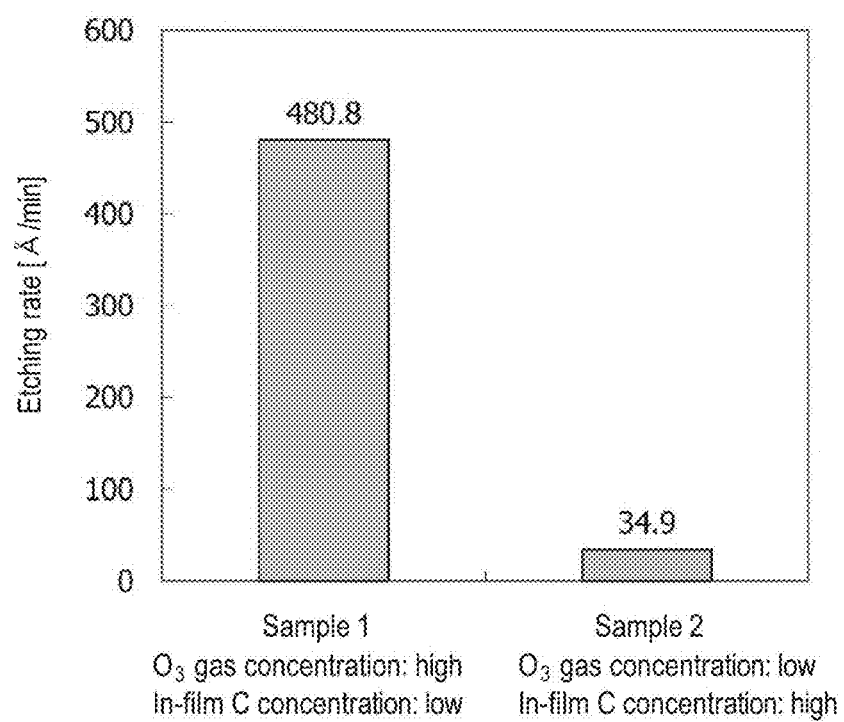

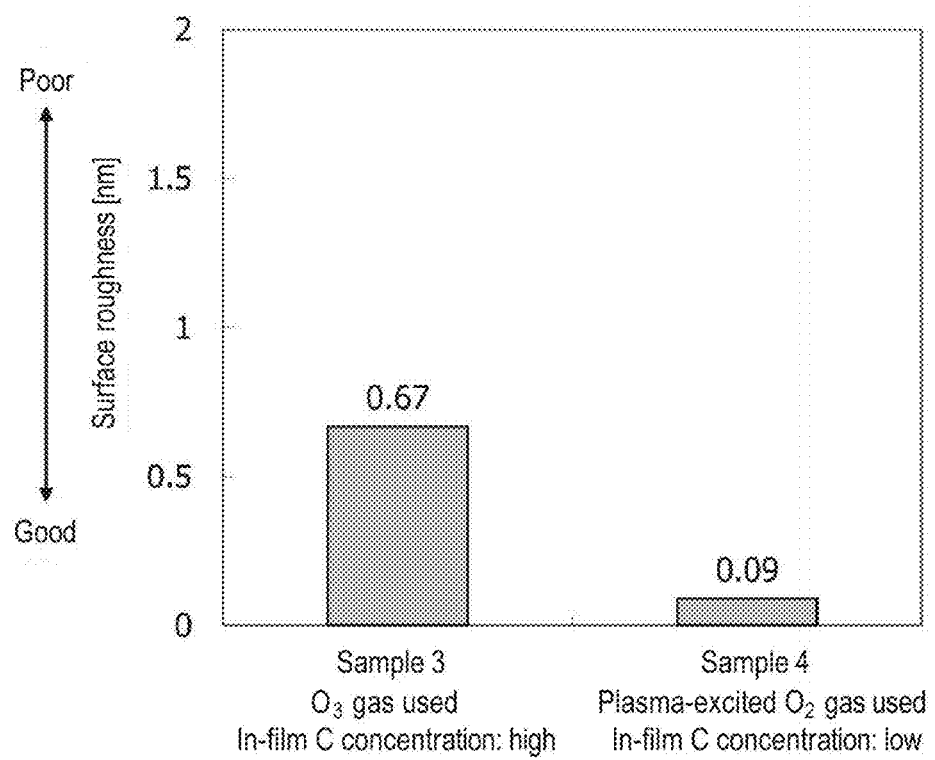

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-182437, filed on Sep. 8, 2014, the entire contents of which are incorporated herein by reference.

TECHNICAL FIELD

The present disclosure relates to a method of manufacturing a semiconductor device, a substrate processing apparatus, and a recording medium.

BACKGROUND

As an example of procedures of manufacturing a semiconductor device, a procedure of forming an oxide film containing carbon (C) on a substrate is often carried out. In some cases, by allowing C to be contained in an oxide film, it becomes possible to improve an etching resistance or the like of the film.

According to extensive studies of the present inventors, it was found that, if C is contained in an oxide film, the surface roughness of the film is sometimes reduced.

SUMMARY

The present disclosure provides some embodiments of a technique capable of forming a film which is superior in etching resistance and surface roughness.

According to one embodiment of the present disclosure, there is provided a technique, which includes forming a laminated film on a substrate by performing a cycle a predetermined number of times, the cycle including forming a first film which contains at least a predetermined element and oxygen, and forming a second film which contains at least the predetermined element, oxygen and carbon, wherein the first film and the second film are laminated to form the laminated film.

BRIEF DESCRIPTION OF THE DRAWINGS

FIG. 9 is a view illustrating an evaluation result of an etching resistance of an oxide film containing C.

FIG. 10 is a view illustrating an evaluation result of a surface roughness of an oxide film containing C.

DETAILED DESCRIPTION

One Embodiment of the Present Disclosure

One embodiment of the present disclosure will now be described mainly with reference to FIGS. 1 to 3.

(1) Configuration of Substrate Processing Apparatus

Figure 1:
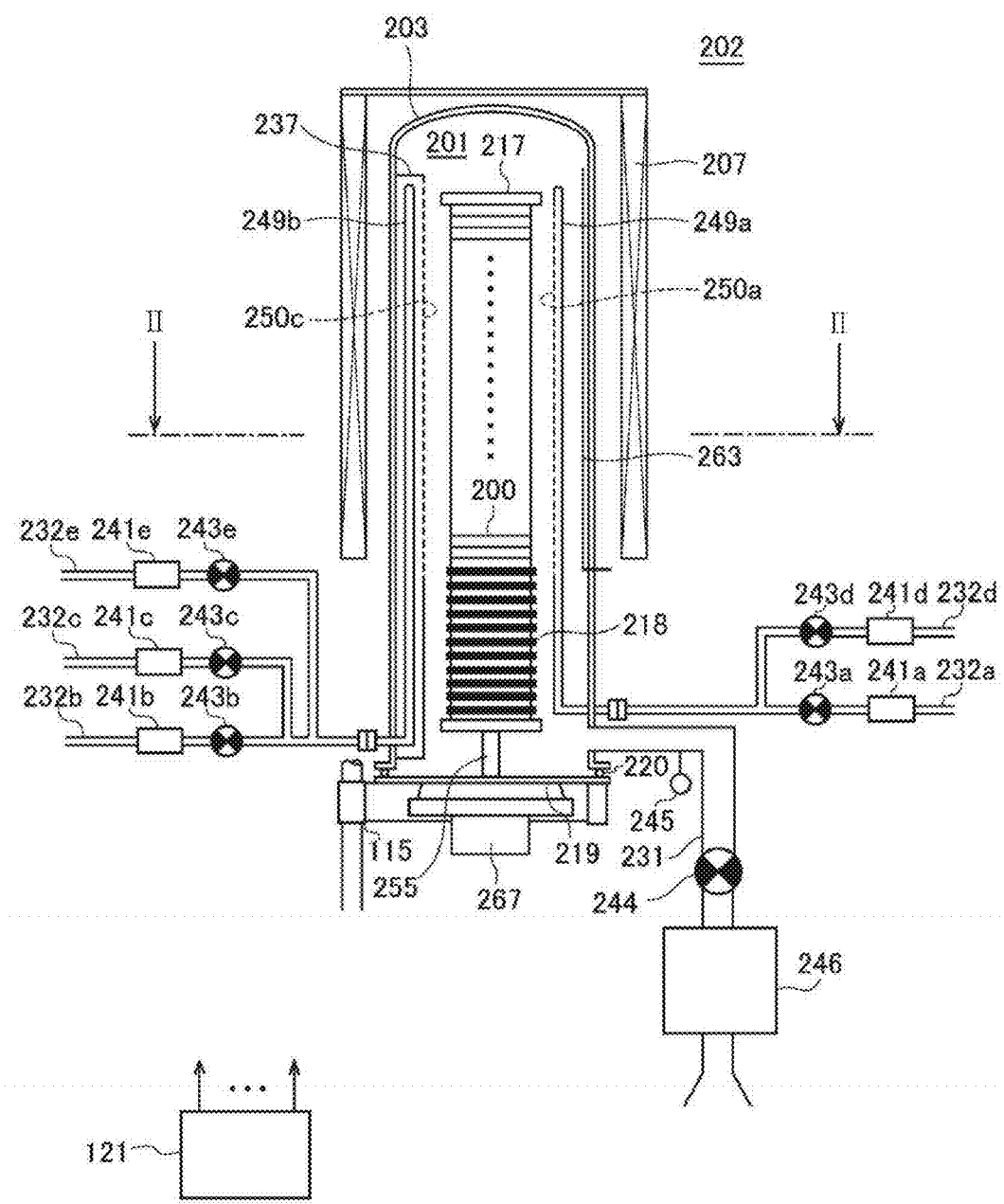
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an excitation part (an activation mechanism) configured to thermally excite (activate) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a and 249b are installed in the process chamber 201 to penetrate through a lower portion of the reaction tube 203. The nozzles 249a and 249b are made of, e.g., a heat resistant material such as quartz, SiC or the like.

Gas supply pipes 232a and 232b are respectively connected to the nozzles 249a and 249b. A gas supply pipe 232c is connected to the gas supply pipe 232b. In this way, the two nozzles 249a and 249b and the three gas supply pipes 232a to 232c are installed in the reaction tube 203 and are capable of supplying plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a to 241c, which are flow rate controllers (flow rate control parts), and valves 243a to 243c, which are opening/closing valves, are sequentially installed in the gas supply pipes 232a to 232c from the corresponding upstream sides. Gas supply pipes 232d and 232e, which supply an inert gas, are respectively connected to the gas supply pipes 232a and 232b at the downstream side of the valves 243a and 243b. MFCs 241d and 241e, which are flow rate controllers (flow rate control parts), and valves 243d and 243e, which are opening/closing valves, are sequentially installed in the gas supply pipes 232d and 232e from the corresponding upstream sides.

The nozzle 249a is connected to an end portion of the gas supply pipe 232a. As shown in FIG. 2, the nozzle 249a is disposed in an annular space between the inner wall of the reaction tube 203 and the wafers 200 such that the nozzles 249a extends upward along an arrangement direction of the wafers 200 from a lower portion of the inner wall of the reaction tube 203 to an upper portion thereof. Specifically, the nozzle 249a is installed along a wafer arrangement region in which the wafers 200 are arranged and in a region that horizontally surrounds the wafer arrangement region at a side of the wafer arrangement region. That is to say, the nozzle 249a is installed at a lateral side of the end portions (peripheral edge portions) of the wafers 200 carried into the process chamber 201, in a perpendicular relationship with the surfaces (flat surfaces) of the wafers 200. The nozzle 249a is configured as an L-shaped long nozzle. A horizontal portion of the nozzle 249a is installed to penetrate a lower sidewall of the reaction tube 203. A vertical portion of the nozzle 249a is installed to extend upward at least from one end portion of the wafer arrangement region toward the other end portion thereof. A plurality of gas supply holes 250a for supplying a gas is formed on the side surface of the nozzle 249a. Each of the gas supply holes 250a is opened toward the center of the reaction tube 203 to allow the gas to be supplied toward the wafers 200. The gas supply holes 250a may be formed in a plural number so as to span from the lower portion of the reaction tube 203 to the upper portion thereof. The respective gas supply holes 250a may have the same opening area. Further, the gas supply holes 250a may be formed at a predetermined opening pitch.

The nozzle 249b is connected to an end portion of the gas supply pipe 232b. The nozzle 249b is installed within a buffer chamber 237. The buffer chamber 237 serves also as a gas distribution space. The buffer chamber 237 is installed in an annular space defined between the inner wall of the reaction tube 203 and the wafers 200 and in a region spanning from the lower portion of the inner wall of the reaction tube 203 to the upper portion thereof, so as to extend along the arrangement direction of the wafers 200. In other words, the buffer chamber 237 is installed at the lateral side of the end portions of the wafers 200 carried into the process chamber 201. Gas supply holes 250c configured to supply a gas is formed in the end portion of the wall of the buffer chamber 237 adjoining the wafers 200. The gas supply holes 250c are opened toward the center of the reaction tube 203 and are configured to supply a gas toward the wafers 200. The gas supply holes 250c are formed in a plural number so as to span from the lower portion of the reaction tube 203 to the upper portion thereof. The respective gas supply holes 250c may have the same opening area and may be formed at a regular opening pitch.

The nozzle 249b is installed at the opposite end portion of the buffer chamber 237 from the end portion in which the gas supply holes 250c are formed, so as to extend upward in the arrangement direction of the wafers 200 from the lower portion of the inner wall of the reaction tube 203 to the upper portion thereof. Specifically, the nozzle 249b is installed along the wafer arrangement region in which the wafers 200 are arranged and in a region that horizontally surrounds the wafer arrangement region. In other words, the nozzle 249b is installed at a lateral side of end portions of the wafers 200 carried into the process chamber 201, in a perpendicular relationship with the surfaces of the wafers 200. The nozzle 249b is configured as an L-shaped long nozzle. A horizontal portion of the nozzle 249b is installed to penetrate a lower sidewall of the reaction tube 203. A vertical portion of the nozzle 249b is installed to extend upward at least from one end portion of the wafer arrangement region toward the other end portion thereof. A plurality of gas supply holes 250b for supplying a gas is formed on the side surface of the nozzle 249b. The gas supply holes 250b are opened toward the center of the buffer chamber 237. Similar to the gas supply holes 250c, the gas supply holes 250b are formed in a plural number so as to span from the lower portion of the reaction tube 203 to the upper portion thereof. If a pressure difference between an interior of the buffer chamber 237 and an interior of the process chamber 201 is small, the gas supply holes 250b may be configured to have the same opening area. Further, the gas supply holes 250b may be formed at a predetermined opening pitch from an upstream side (i.e., a lower portion) to a downstream side (i.e., an upper portion). In contrast, if the pressure difference between the interior of the buffer chamber 237 and the interior of the process chamber 201 is large, the opening area of the gas supply holes 250b may be set to become gradually larger from the upstream side toward the downstream side. Alternatively or additionally, the opening pitch of the gas supply holes 250b may be set to become gradually smaller from the upstream side toward the downstream side.

By adjusting the opening area and the opening pitch of the gas supply holes 250b from the upstream side to the downstream side as described above, a gas may be injected from the respective gas supply holes 250b substantially at the same flow rate but at different flow velocities. The gas injected from the individual gas supply holes 250b is first introduced into the buffer chamber 237. This makes it possible to make uniform the flow velocities of the gas within the buffer chamber 237. The particle velocity of the gas injected from the respective gas supply holes 250b into the buffer chamber 237 are reduced in the buffer chamber 237. Then, the gas is injected from the respective gas supply holes 250c into the process chamber 201. The gas which has flown into the buffer chamber 237 from the respective gas supply holes 250b has a uniform flow rate and a uniform flow velocity when ejected from the respective gas supply holes 250c into the process chamber 201.

As described above, in the present embodiment, a gas is transferred through the nozzles 249a and 249b, which are disposed in the vertically-elongated annular space, i.e., a cylindrical space, defined by the inner surface of the sidewall of the reaction tube 203 and the end portions (peripheral edge portions) of the wafers 200 arranged within the reaction tube 203. The gas is initially injected into the reaction tube 203, near the wafers 200, through the gas supply holes 250a to 250c formed in the nozzles 249a and 249b and the buffer chamber 237. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A precursor having a chemical bond of a predetermined element and carbon (C), for example, an alkylene halosilane precursor gas containing Si as the predetermined element, an alkylene group, and a halogen group and having a chemical bond of Si and C (an Si—C bond), or an alkyl halosilane precursor gas containing Si, an alkyl group, and a halogen group and having a Si—C bond, is supplied from the gas supply pipe 232a into the process chamber 201 through the MFC 241a, the valve 243a and the nozzle 249a.

In this configuration, the alkylene group is a functional group obtained by removing two hydrogen (H) atoms from chain-shaped saturated hydrocarbon (alkane), which is denoted as a chemical formula $C_nH_{2n+2}$ and is an aggregate of atoms that are denoted as a chemical formula $C_nH_{2n}$. The alkylene group includes a methylene group, an ethylene group, a propylene group, a butylene group, and so forth. The alkyl group is a functional group obtained by removing one H atom from chain-shaped saturated hydrocarbon, which is denoted as a chemical formula $C_nH_{2n+2}$ and is an aggregate of atoms that are denoted as a chemical formula $C_nH_{2n+1}$. The alkyl group includes a methyl group, an ethyl group, a propyl group, a butyl group, or the like. The halogen group includes a chloro group, a fluoro group, a bromo group, an iodine group, or the like. As such, the halogen group includes a halogen element such as chlorine (Cl), fluorine (F), bromine (Br), iodine (I) or the like.

As the alkylene halosilane precursor gas, it may be possible to use, e.g., a precursor gas containing Si, a methylene group (—CH$_2$—) as an alkylene group and a chloro group (Cl) as a halogen group, namely a chlorosilane precursor gas containing a methylene group, or a precursor gas containing Si, an ethylene group (—C$_2$H$_4$—) as an alkylene group and a chloro group (Cl) as a halogen group, namely a chlorosilane precursor gas containing an ethylene group. As the chlorosilane precursor gas containing a methylene group, it may be possible to use, e.g., a methylene bis(trichlorosilane) gas, namely a bis(trichlorosilyl)methane ((SiCl$_3$)$_2$CH$_2$, abbreviation: BTCSM) gas. As the chlorosilane precursor gas containing an ethylene group, it may be possible to use, e.g., an ethylene bis(trichlorosilane) gas, namely a 1,2-bis(trichlorosilyl)ethane ((SiCl$_3$)$_2$C$_2$H$_4$, abbreviation: BTCSE) gas.

Figure 11A:
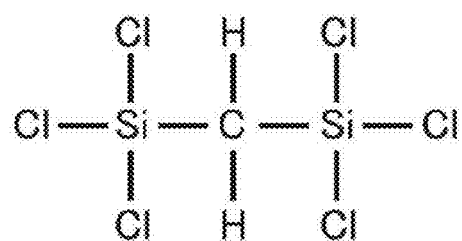
FIG. 11A is a view illustrating a chemical structural formula of BTCSM.

As shown in FIG. 11A, BTCSM contains one methylene group as an alkylene group in its chemical structural formula (in one molecule). Each of two bonds of the methylene group is bonded to Si, such that a Si—C—Si bond is formed.

Figure 11B:
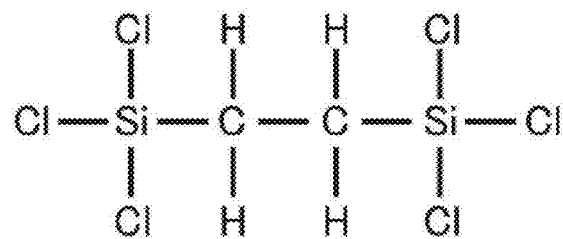
FIG. 11B is a view illustrating a chemical structural formula of BTCSE.

As shown in FIG. 11B, BTCSE contains one ethylene group as an alkylene group in one molecule. Each of two dangling bonds between the ethylene group is bonded to Si such that a Si—C—C—Si bond is formed.

As the alkyl halosilane precursor gas, it may be possible to use, e.g., a precursor gas containing Si, a methyl group (—CH$_3$) as an alkyl group and a chloro group (Cl) as a halogen group, namely a chlorosilane precursor gas containing a methyl group. As the chlorosilane precursor gas containing a methyl group, it may be possible to use, e.g., a 1,1,2,2-tetrachloro-1,2-dimethyldisilane ((CH$_3$)$_2$Si$_2$Cl$_4$, abbreviation: TCDMDS) gas, a 1,2-dichloro-1,1,2,2-tetramethyldisilane ((CH$_3$)$_4$Si$_2$Cl$_2$, abbreviation: DCTMDS) gas, a 1-monochloro-1,1,2,2,2-pentamethyldisilane ((CH$_3$)$_5$Si$_2$Cl, abbreviation: MCPMDS) gas, or the like. Unlike the alkylene halosilane precursor gas such as the BTCSE gas or the BTCSM gas, the alkyl halosilane precursor gas such as the TCDMDS gas, the DCTMDS gas or the MCPMDS gas is a gas having a Si—Si bond, namely a precursor gas containing a predetermined element and a halogen element and having a chemical bond of the predetermined element.

Figure 11C:
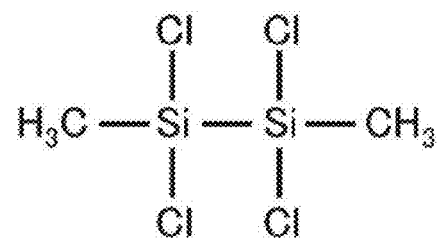
FIG. 11C is a view illustrating a chemical structural formula of TCDMDS.

As shown in FIG. 11C, TCDMDS contains two methyl groups as alkyl groups in one molecule. Each of dangling bonds between the two methyl groups is bonded to Si such that Si—C bonds are formed. TCDMDS is a derivative of disilane, and has a Si—Si bond. As such, TCDMDS has a Si—Si—C bond in which Si and Si are bonded to each other, and Si is bonded to C.

Figure 11D:
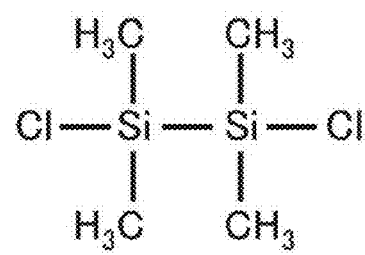
FIG. 11D is a view illustrating a chemical structural formula of DCTMDS.

As shown in FIG. 11D, DCTMDS contains four methyl groups as alkyl groups in one molecule. Each of dangling bonds between the four methyl groups is bonded to Si, such that Si—C bonds are formed. DCTMDS is a derivative of disilane, and has a Si—Si bond. As such, DCTMDS has a Si—Si—C bond in which Si and Si are bonded to each other, and Si is bonded to C.

Figure 11E:
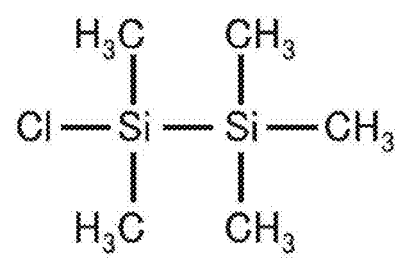
FIG. 11E is a view illustrating a chemical structural formula of MCPMDS.

As shown in FIG. 11E, MCPMDS contains five methyl groups as alkyl groups in one molecule. Each of dangling bonds between the five methyl groups is bonded to Si, such that Si—C bonds are formed. MCPMDS is a derivative of disilane, and has a Si—Si bond. As such, MCPMDS has a Si—Si—C bond in which Si and Si are bonded to each other, and Si is bonded to C. Unlike BTCSM, BTCSE, TCDMDS, and DCTMDS, MCPMDS has an asymmetry structure in which the methyl groups and the chloro groups surrounding Si are asymmetrically arranged in one molecule. As described above, in the present embodiment, it may be possible to use a precursor gas having an asymmetric chemical structural formula in addition to a precursor gas having a symmetric chemical structural formula as shown in FIGS. 11A to 11D.

The alkylene halosilane precursor gas such as the BTCSM gas or the BTCSE gas, and the alkyl halosilane precursor gas such as the TCDMDS gas, the DCTMDS gas, or the MCPMDS gas may be a precursor gases which contains at least two Si atoms in one molecule, contains C and Cl, and has Si—C bonds. In a substrate processing process, which will be described later, this gas acts as a Si source and a C source. The BTCSM gas or the BTCSE gas may be referred to as an alkylene chlorosilane precursor gas. The TCDMDS gas, the DCTMDS gas, and the MCPMDS gas may be referred to as an alkyl chlorosilane precursor gas.

In the subject specification, the precursor gas refers to a precursor in a gaseous state, for example, a gas obtained by vaporizing a precursor which is in a liquid state under room temperature and atmospheric pressure, or a precursor which stays in a gaseous state under room temperature and atmospheric pressure. When the term "precursor" is used herein, it may refer to "a liquid precursor staying in a liquid state," "a precursor gas staying in a gaseous state," or both. In the case of using a liquid precursor staying in a liquid state under a room temperature and an atmospheric pressure, such as TCDMDS or the like, the liquid precursor is vaporized by a vaporization system, such as a vaporizer or a bubbler, and is supplied as a precursor gas (a TCDMDS gas or the like).

A reaction gas, e.g., an oxygen (O)-containing gas (O-containing gas), which differs in chemical structure (molecular structure) from the aforementioned precursor gas, may be supplied from the gas supply pipe 232b into the process chamber 201 through the MFC 241b, the valve 243b, the nozzle 249b and the buffer chamber 237. In a substrate processing procedure which will be described later, the O-containing gas acts as an oxidizing gas, i.e., an O source. As the O-containing gas, it may be possible to use, e.g., an ozone ($O_3$) gas.

A reaction gas, e.g., a carbon (C)-containing gas (C-containing gas), which differs in chemical structure from the aforementioned precursor gas, may be supplied from the gas supply pipe 232b into the process chamber 201 through the MFC 241b, the valve 243b, the nozzle 249b and the buffer chamber 237. As the C-containing gas, it may be possible to use, e.g., a hydrocarbon-based gas. The hydrocarbon-based gas may be referred to as a substance consisting of only two elements C and H. The hydrocarbon-based gas acts as a C source in a substrate processing procedure, which will be described later. As the hydrocarbon-based gas, it may be possible to use, e.g., a propylene ($C_3H_6$) gas.

A reaction gas, e.g., a hydrogen (H)-containing gas (H-containing gas), which differs in chemical structure from the aforementioned precursor gas, may be supplied from the gas supply pipe 232c into the process chamber 201 through the MFC 241c, the valve 243c, the gas supply pipe 232b, the nozzle 249b and the buffer chamber 237. The H-containing gas is not capable of providing an oxidizing action when it is used alone. In a substrate processing procedure which will be described later, the H-containing gas reacts with the O-containing gas under specific conditions and generates oxidizing species such as atomic oxygen (O) and the like, thereby acting to improve the efficiency of an oxidizing process. Thus, similar to the O-containing gas, the H-containing gas may be included in the oxidizing gas. As the H-containing gas, it may be possible to use, e.g., a hydrogen ($H_2$) gas.

An inert gas, e.g., a nitrogen ($N_2$) gas, is supplied from the gas supply pipes 232d and 232e into the process chamber 201 through the MFCs 241d and 241e, the valves 243d and 243e, the gas supply pipes 232a and 232b, the nozzles 249a and 249b, and the buffer chamber 237. The inert gas supplied through the gas supply pipes 232d and 232e acts as a purge gas, a dilution gas or a carrier gas.

In the case of supplying the aforementioned precursor gas from the gas supply pipe 232a, a precursor gas supply system includes the gas supply pipe 232a, the MFC 241a, and the valve 243a. The precursor gas supply system may include the nozzle 249a. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

In the case of supplying an O-containing gas from the gas supply pipe 232b, an O-containing gas supply system includes the gas supply pipe 232b, the MFC 241b, and the valve 243b. The O-containing gas supply system may also include the nozzle 249b and the buffer chamber 237. The O-containing gas supply system may be referred to as an oxidizing gas supply system or an oxidant supply system.

In the case of supplying a C-containing gas from the gas supply pipe 232b, a C-containing gas supply system includes the gas supply pipe 232b, the MFC 241b, and the valve 243b. The C-containing gas supply system may also include the nozzle 249b and the buffer chamber 237. In the case of supplying a hydrocarbon-based gas from the gas supply pipe 232b, the C-containing gas supply system may be referred to as a hydrocarbon-based gas supply system or a hydrocarbon supply system.

In the case of supplying an H-containing gas from the gas supply pipe 232c, an H-containing gas supply system includes the gas supply pipe 232c, the MFC 241c, and the valve 243c. The carbon-containing gas supply system may also include the nozzle 249b, which is disposed at a downstream side of a connection portion of the gas supply pipe 232b and the gas supply pipe 232c, and the buffer chamber 237. In the case of performing the supply of the H-containing gas from the gas supply pipe 232c simultaneously with the supply of the O-containing gas from the gas supply pipe 232b, the H-containing gas supply system may be included in the aforementioned oxidizing gas supply system.

Among the gas supply systems described above, one or all of the gas supply systems which supply reaction gases may be referred to as a reaction gas supply system or a reactant supply system.

Furthermore, an inert gas supply system includes the gas supply pipes 232d and 232e, the MFCs 241d and 241e, and the valves 243d and 243e. The inert gas supply system may be referred to as a purge gas supply system, a dilution gas supply system or a carrier gas supply system.

Figure 2:
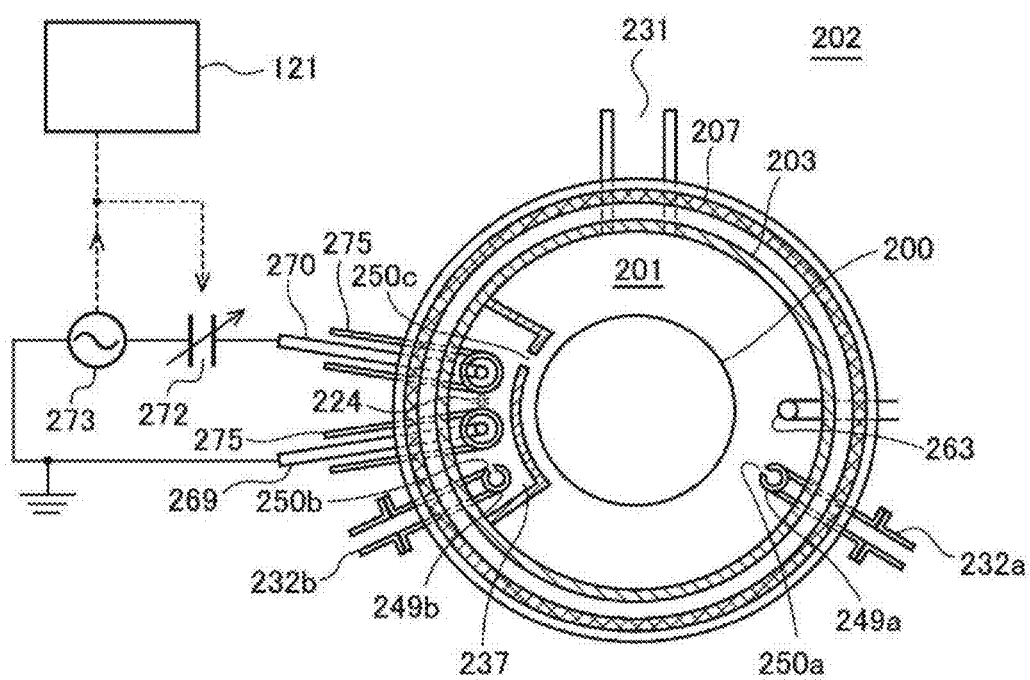
FIG. 2 is a schematic configuration view of the vertical processing furnace of the substrate processing apparatus suitably used in one embodiment of the present disclosure, in which a portion of the processing furnace is shown in a cross section taken along line II-II in FIG. 1.

In the buffer chamber 237, as illustrated in FIG. 2, two rod-shaped electrodes 269 and 270, which are made of a conductor and have an elongated structure, are disposed along the stacking direction of the wafers 200 to span from the lower portion of the reaction tube 203 to the upper portion thereof. Each of the rod-shaped electrodes 269 and 270 is disposed parallel to the nozzle 249b. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to ground having a reference electric potential. By applying high-frequency (RF) power from the high-frequency power source 273 between the rod-shaped electrodes 269 and 270 via the matcher 272, plasma is generated in a plasma generation region 224 between the rod-shaped electrodes 269 and 270. A plasma source as a plasma generator (plasma generating part) includes the rod-shaped electrodes 269 and 270 and the electrode protection tubes 275. The matcher 272 and the high-frequency power source 273 may also be included in the plasma source. As will be described later, the plasma source functions as an exciting part (an activating mechanism) that plasma-excites gas, namely excites (activates) gas into a plasma state.

The electrode protection tube 275 has a structure in which each of the rod-shaped electrodes 269 and 270 can be inserted into the buffer chamber 237 while keeping each of the rod-shaped electrodes 269 and 270 isolated from an internal atmosphere of the buffer chamber 237. If an O concentration within the electrode protection tube 275 is substantially equal to an O concentration in the ambient air (atmosphere), each of the rod-shaped electrodes 269 and 270 inserted into the electrode protection tubes 275 is oxidized by the heat generated from the heater 207. By charging the interior of the electrode protection tubes 275 with an inert gas such as a $N_2$ gas or the like, or by purging the interior of the electrode protection tubes 275 with an inert gas such as a $N_2$ gas or the like through the use of an inert gas purge mechanism, it is possible to reduce the O concentration within the electrode protection tubes 275, thereby preventing oxidation of the rod-shaped electrodes 269 and 270.

An exhaust pipe 231 for exhausting an internal atmosphere of the process chamber 201 is connected to the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an Auto Pressure Controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system includes the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later is installed at a side of the seal cap 219 apposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a desired temperature distribution. Similar to the nozzles 249a and 249b, the temperature sensor 263 is formed in an L-shape. The temperature sensor 263 is installed along the inner wall of the reaction tube 203.

Figure 3:
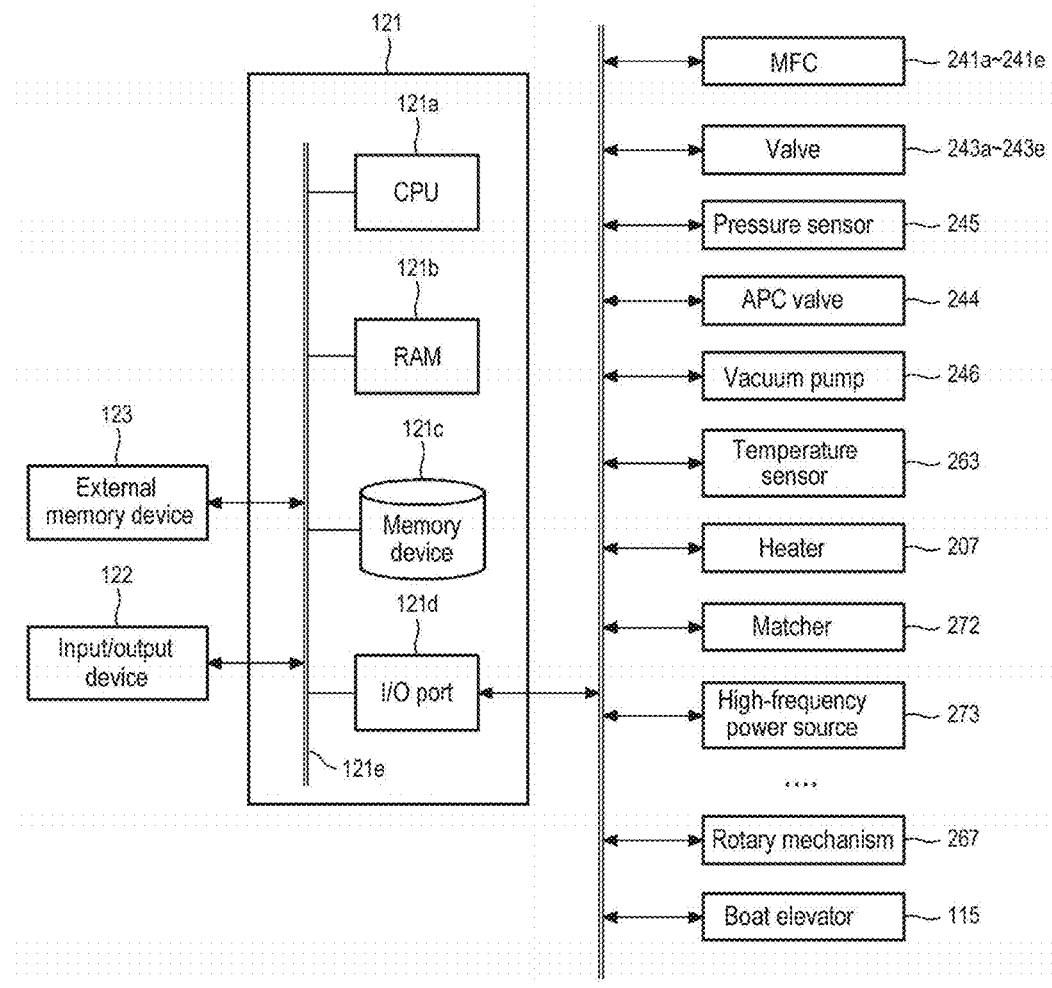
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. Also, the process recipe functions as a program for the controller 121 to execute each sequence in the substrate processing procedure, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the high-frequency power source 273, the matcher 272, the rotary mechanism 267, the boat elevator 115, and the like.

The CPU 121a is configured to read and execute the control program from the memory device 121c. The CPU 121a also reads the process recipe from the memory device 121c according to an input of an operation command from the input/output device 122. In addition, the CPU 121a is configured to control the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the power supply operation of the high-frequency power source 273, the impedance adjusting operation performed by the matcher 272, the operation of rotating the boat 217 with the rotary mechanism 267 and adjusting the rotation speed of the boat 217, the operation of moving the boat 217 up and down with the boat elevator 115, and the like, according to contents of the read process recipe.

Moreover, the controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for providing the program to the computer is not limited to the case in which the program is provided through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as a "recording medium." In addition, when the term "recording medium" is used herein, it may include a case of including only the memory device 121c, a case of including only the external memory device 123, or a case of including both the memory device 121c and the external memory device 123.

(2) Substrate Processing Process

An example of a procedure for forming a thin film on a substrate, which is one of the procedures for manufacturing a semiconductor device by using the above described substrate processing apparatus, is described below with reference to FIGS. 4 and 5. In the following descriptions, the operations of the respective units or parts constituting the substrate processing apparatus are controlled by the controller 121.

Figure 4:
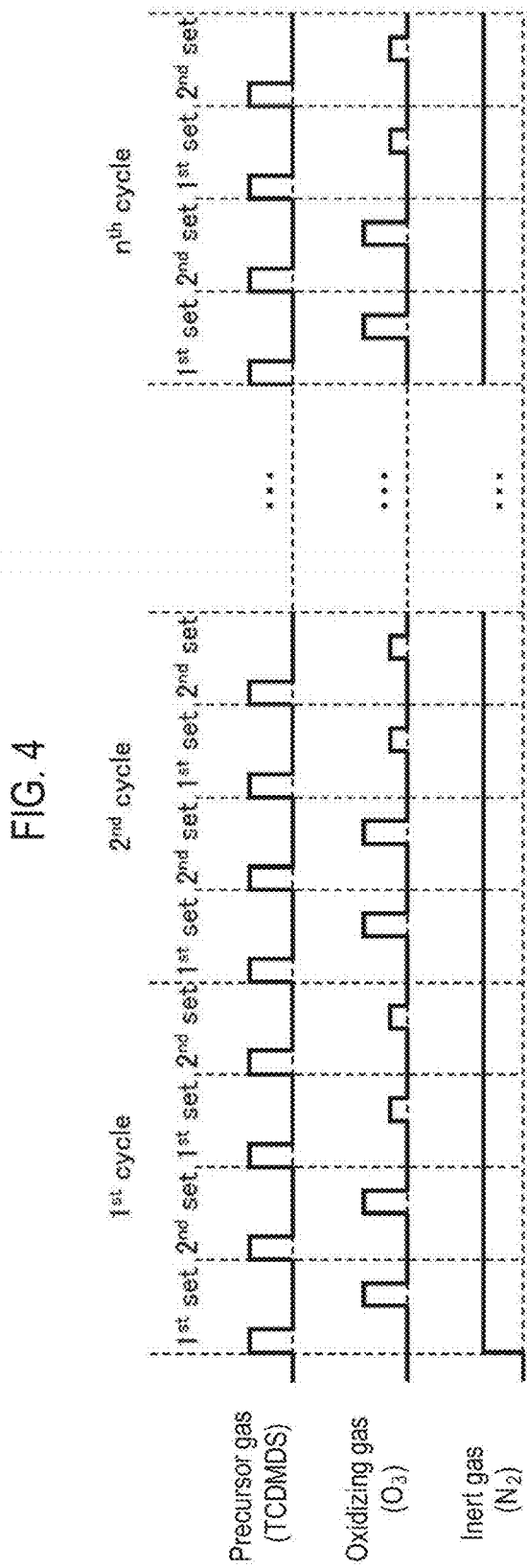
FIG. 4 is a view illustrating gas supply timings in a film forming sequence according to one embodiment of the present disclosure, in which view there is illustrated a state in which oxidation conditions are made different by changing a supply flow rate of an oxidizing gas.
Figure 5:
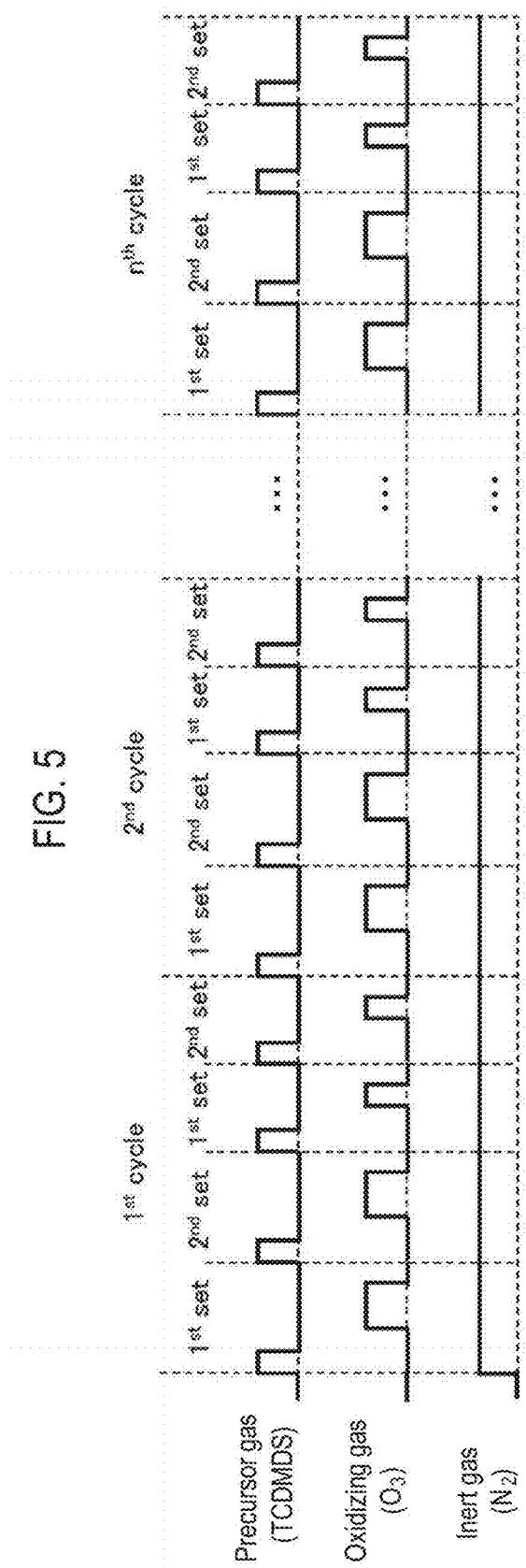
FIG. 5 is a view illustrating gas supply timings in a film forming sequence according to one embodiment of the present disclosure, in which view there is illustrated a state in which oxidation conditions are made different by changing a gas supply time of an oxidizing gas.

In a film forming sequence shown in FIGS. 4 and 5, a C-containing silicon oxide film (SiO film) as a laminated film composed of a first film and a second film laminated on a wafer 200 as a substrate is formed on a wafer 200 by performing, a predetermined number of times (n times), a cycle that includes a step of forming the first film containing at least Si and O as predetermined elements and a step of forming the second film containing at least Si, O and C as predetermined elements. The C-containing SiO film may be referred to as a C-added (doped) SiO film, a C-doped SiO film, a C-containing SiO film, or a SiOC film.

At the step of forming the first film, a C-free silicon oxide film (SiO film) or a C-containing SiO film (SiOC film) is formed as the first film by performing, a predetermined number of times ($m_1$ times), a first set that includes Step 1 of supplying a TCDMDS gas as a precursor gas to the wafer 200 and Step 2 of supplying an $O_3$ gas as an oxidizing gas to the wafer 200 under first oxidation conditions. In the case of forming the C-containing SiO film as the first film, a C concentration in the first film is set to become lower than a C concentration in the second film which will be described later.

At the step of forming the second film, a C-containing SiO film (SiOC film) is formed as the second film by performing, a predetermined number of times ($m_2$ times), a second set that includes Step 3 of supplying a TCDMDS gas as a precursor gas to the wafer 200 and Step 4 of supplying an $O_3$ gas as an oxidizing gas to the wafer 200 under second oxidation conditions differing from the first oxidation conditions.

As used herein, the phrase "performing a first set, a second set or a cycle a predetermined number of times" means that the set or the cycle is performed once or a plurality of times. That is to say, the phrase may also mean that the set or the cycle is performed one or more times. FIGS. 4 and 5 illustrates an example in which each of the first set and the second set is performed twice and the cycle is repeated n times.

In the subject specification, for the sake of convenience, the aforementioned film forming sequence may be represented as follows.

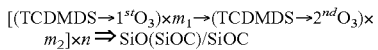

$[(TCDMDS \to 1^{st}O_3) \times m_1 \to (TCDMDS \to 2^{nd}O_3) \times m_2] \times n \Rightarrow SiO(SiOC)/SiOC$ As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of the wafer, which is a laminated body".

As such, as used herein, the phrase "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the phrase "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

(Wafer Charging and Boat Loading)

When the plurality of wafers 200 is charged on the boat 217 (wafer charging) as illustrated in FIG. 1, the boat 217 charged with the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

An internal pressure of the process chamber 201, namely the space in which the wafers 200 exist is vacuum-exhausted (pressure-reducing exhaust) by the vacuum pump 246 to reach a desired pressure (desired vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 reaches a desired temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.
(Step of Forming First Film)

Next, the following two steps, i.e., Steps 1 and 2, are sequentially performed.

[Step 1]
(TCDMDS Gas Supply)

At this step, a TCDMDS gas is supplied to the wafer 200 disposed within the process chamber 201.

The valve 243a is opened to flow a TCDMDS gas through the gas supply pipe 232a. The TCDMDS gas is flow rate-adjusted by the MFC 241a. The TCDMDS gas is supplied into the process chamber 201 via the nozzle 249a and is exhausted from the exhaust pipe 231. At this time, the TCDMDS gas is supplied to the wafer 200. At the same time, the valve 243d is opened to flow a $N_2$ gas through the gas supply pipe 232d. The $N_2$ gas is flow rate-adjusted by the MFC 241d. The flow rate-adjusted $N_2$ gas is supplied into the process chamber 201 together with the TCDMDS gas and is exhausted from the exhaust pipe 231.

In order to prevent the TCDMDS gas from infiltrating into the nozzle 249b and the buffer chamber 237, the valve 243e is opened to flow the $N_2$ gas through the gas supply pipe 232e. The $N_2$ gas is supplied into the process chamber 201 through the gas supply pipe 232b, the nozzle 249b, and the buffer chamber 237 and is exhausted from the exhaust pipe 231.

A supply flow rate of the TCDMDS gas controlled by the MFC 241a is set to fall within a range of, e.g., 1 to 2,000 sccm, specifically, 10 to 1,000 sccm. Each of supply flow rates of the $N_2$ gas controlled by the MFCs 241d and 241e is set to fall within a range of, e.g., 100 to 10,000 sccm. An internal pressure of the process chamber 201 is set to fall within a range of, e.g., 1 to 2,666 Pa, specifically 67 to 1,333 Pa. A time period for supplying the TCDMDS gas to the wafer 200, namely the gas supply time (irradiation time), is set to fall within a range of, e.g., 1 to 120 seconds, specifically, 1 to 60 seconds. The temperature of the heater 207 is set such that the temperature of the wafer 200 falls within a range of, e.g., 250 to 700 degrees C., specifically 300 to 650 degrees C., or more specifically 350 to 600 degrees C.

If the temperature of the wafer 200 is lower than 250 degrees C., TCDMDS is hard to be chemisorbed onto the wafer 200, eventually making it impossible to obtain a practical deposition speed. This problem can be solved by setting the temperature of the wafer 200 at a temperature equal to or higher than 250 degrees C. By setting the temperature of the wafer 200 at 300 degrees C. or more, specifically 350 degrees C. or more, it becomes possible to have TCDMDS sufficiently adsorbed onto the wafer 200 to thereby increase the deposition rate. By setting the temperature of the wafer 200 at 500 degrees C. or more, it becomes possible to have BTCSM sufficiently adsorbed onto the wafer 200 and to obtain a sufficient deposition speed.

If the temperature of the wafer 200 exceeds 700 degrees C., a CVD reaction may be made too strong (an excessive gas phase reaction may be generated). In this case, the film thickness uniformity may be hard to control and often deteriorate. By setting the temperature of the wafer 200 at 700 degrees C. or less, a suitable gas phase reaction may be generated. In this way, the deterioration of the film thickness uniformity can be suppressed, and thus the film thickness uniformity can be controlled. In particular, if the temperature of the wafer 200 is set at 650 degrees C. or less, specifically 600 degrees C. or less, the surface reaction becomes more dominant than the gas phase reaction. Thus, it becomes possible to secure the film thickness uniformity and control the film thickness uniformity.

Accordingly, the temperature of the wafer 200 may be set to fall within a range of 250 to 700 degrees C., specifically, 300 to 650 degrees C., or more specifically 350 to 600 degrees C.

By supplying the TCDMDS gas to the wafer 200 under the aforementioned conditions, a first layer, e.g., a Si-containing layer containing C and Cl and having a thickness of less than one atomic layer to several atomic layers, is formed on the uppermost surface of the wafer 200. The Si-containing layer containing C and Cl may be a Si layer, an adsorption layer of TCDMDS, or both.

The Si-containing layer containing C and Cl is a generic name that encompasses a continuous or discontinuous layer containing C and Cl, which is composed of Si, and a Si thin film containing C and Cl, which is formed of the layers overlapping with one another. The continuous layer containing C and Cl, which is composed of Si, is sometimes referred to as a Si thin film containing C and Cl. The Si which constitutes the Si layer containing C and Cl includes not only Si whose bond to C or Cl is not completely broken, but also Si whose bond to C or Cl is completely broken.

The adsorption layer of TCDMDS includes a continuous adsorption layer composed of BTCSM molecules and a discontinuous adsorption layer composed of TCDMDS molecules. That is to say, the adsorption layer of TCDMDS includes an adsorption layer having a thickness of one molecular layer or less, which is composed of TCDMDS molecules. The TCDMDS molecules that constitute the adsorption layer of BTCSM include a TCDMDS molecule in which a part of bonds between Si and C or Cl is broken. In other words, the adsorption layer of TCDMDS may be a physical adsorption layer of TCDMDS, a chemisorption layer of TCDMDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer containing C and Cl may include both a Si layer containing C and Cl and an adsorption layer of TCDMDS. As described above, expressions such as "one atomic layer", "several atomic layers" and the like will be used to indicate the Si-containing layer containing C and Cl.

Under a condition in which the TCDMDS gas is autolyzed (or pyrolyzed), i.e., a condition in which a pyrolysis reaction of the TCDMDS gas is generated, Si is deposited on the wafer 200 to form the Si layer containing n C and Cl. Under a condition in which the TCDMDS gas is not autolyzed (or pyrolyzed), i.e., a condition in which a pyrolysis reaction of the TCDMDS gas is not generated, TCDMDS is adsorbed onto the wafer 200 to form an adsorption layer of TCDMDS. From the viewpoint of increasing the deposition rate, it may be more advantageous to form the Si layer containing C and Cl on the wafer 200 than to form the adsorption layer of TCDMDS on the wafer 200.

If the thickness of the first layer formed on the wafer 200 exceeds several atomic layers, a modifying reaction at Step 2, which will be described later, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer equal to or less than one atomic layer, i.e., at one atomic layer or less than, it is possible to relatively increase the action of the modifying reaction at Step 2, which will be described later, and to shorten the time required in the modifying reaction at Step 2. It is also possible to shorten the time required in forming the first layer at Step 1. As a result, a processing time per cycle can be shortened, and a total processing time can also be shortened. That is to say, the deposition rate can be increased. In addition, if the thickness of the first layer is set at one atomic layer or less, it is possible to improve the controllability of the film thickness uniformity.

(Residual Gas Removal)

After the first layer is formed, the valve 243a is closed to stop the supply of the TCDMDS gas. At this time, while keeping the APC valve 244 opened, the interior of the process chamber 201 is evacuated by the vacuum pump 246. The TCDMDS gas remaining within the process chamber 201, which has not reacted or which has contributed to the formation of the first layer, is removed from the interior of the process chamber 201. At this time, while keeping the valves 243d and 243e opened, the supply of the $N_2$ gas into the process chamber 201 is maintained. The $N_2$ gas acts as a purge gas. This makes it possible to effectively remove the gas remaining within the process chamber 201 from the interior of the process chamber 201.

In this operation, the gas remaining within the process chamber 201 may not be completely removed and the interior of the process chamber 201 may not be completely purged. If the amount of the gas remaining within the process chamber 201 is small, an adverse effect may not be generated at Step 2, which will be subsequently performed. The flow rate of the $N_2$ gas supplied into the process chamber 201 need not be made large. For example, an amount of the $N_2$ gas to be supplied into the process chamber 201 may be substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to suppress the consumption of the $N_2$ gas to a necessary minimum level.

As the precursor gas, in addition to the TCDMDS gas, it is possible to use, e.g., a halosilane precursor gas containing an alkyl group in a chemical structural formula thereof, such as a DCTMDS gas, an MCPMDS gas or the like, or a halosilane precursor gas containing an alkylene group in a chemical structural formula thereof, such as a BTCSM gas, a BTCSE gas or the like. Furthermore, as the precursor gas, it may be possible to use a halosilane precursor gas containing an amino group in a chemical structural formula thereof. That is to say, as the precursor gas, it is possible to use a silane precursor gas having a Si—C bond and containing at least one of an alkyl group, an alkylene group and an amino group.

As the inert gas, in addition to the $N_2$ gas, it is possible to use, e.g., a rare gas such as an Ar gas, a He gas, a Ne gas, a Xe gas or the like.

[Step 2]

($O_3$ Gas Supply)

After Step 1 is completed, a thermally-activated $O_3$ gas is supplied to the wafer 200 disposed within the process chamber 201, namely the first layer formed on the wafer 200, under first oxidation conditions.

At this step, the opening/closing control of the valves 243b, 243d and 243e is performed in the same procedure as the opening/closing control of the valves 243a, 243d and 243e performed at Step 1. The $O_3$ gas is supplied into the process chamber 201 through the gas supply pipe 232b, the nozzle 249b and the buffer chamber 237 and is exhausted from the exhaust pipe 231. At this time, the $O_3$ gas is supplied to the wafer 200.

A supply flow rate of the $O_3$ gas controlled by the MFC 241b is set to fall within a range of, e.g., 100 to 10,000 sccm. An internal pressure of the process chamber 201 is set to fall within a range of, e.g., 1 to 4,000 Pa, specifically, 1 to 3,000 Pa. A partial pressure of the $O_3$ gas within the process chamber 201 is set to fall within a range of, e.g., 0.01 to 3,960 Pa. By setting the internal pressure of the process chamber 201 to fall within such a relatively high pressure zone, it becomes possible to thermally activate the $O_3$ gas in a non-plasma manner. If the $O_3$ gas is supplied by thermally activating the same, it is possible to generate a relatively soft reaction and to relatively softly perform a modifying process which will be described later. The time period in which the thermally-activated $O_3$ gas is supplied to the wafer 200, namely the gas supply time (irradiation time), is set to fall within a range of, e.g., 1 to 120 seconds, specifically, 1 to 60 seconds. Other processing conditions may be similar to, e.g., the processing conditions of Step 1 described above.

By supplying the $O_3$ gas to the wafer 200 under the aforementioned conditions (first oxidation conditions), it is possible to have the $O_3$ gas react with the first layer formed on the wafer 200, thereby modifying (oxidizing) the first layer. At this time, an O component contained in the $O_3$ gas is added to the first layer, and C contained in the first layer is mostly desorbed at an impurity level, or C contained in the first layer is substantially extinguished. By doing so, a C-free layer containing Si and O, namely a SiO layer (O-containing Si layer), can be formed as a second layer on the wafer 200. Furthermore, at this time, a part of Si—C bonds contained in the first layer may be maintained without being broken. By doing so, a layer containing Si, O and C, namely a C-containing SiO layer (O- and C-containing Si layer), may be formed as a second layer on the wafer 200. In addition, a C concentration in the film is set to become lower than a C concentration in the C-containing SiO layer formed at Step 4 which will be described later. In the following descriptions, the C-containing SiO layer will be often referred to as a SiOC layer.

When forming the second layer, Cl contained in the first layer may become a gaseous substance containing at least Cl during the course of the modifying reaction of the first layer by the $O_3$ gas. The gaseous substance is discharged from the interior of the process chamber 201. That is to say, the impurities such as Cl and the like contained in the first layer are extracted or desorbed from the first layer and are eventually separated from the first layer. As such, the second layer becomes a layer having a smaller amount of impurities such as Cl and the like than the first layer.

(Residual Gas Removal)

After the second layer is formed, the valve 243b is closed to stop the supply of the $O_3$ gas. Then, with the processing procedures similar to those of Step 1, it is possible to remove the $O_3$ gas remaining within the process chamber 201, which has not reacted or which has contributed to the formation of the second layer, or the reaction byproduct remaining within the process chamber 201, from the interior of the process chamber 201. At this time, similar to Step 1, the gas remaining within the process chamber 201 may not be completely removed.

As the oxidizing gas, in addition to the $O_3$ gas, it may be possible to use, e.g., an O-containing gas such as an oxygen ($O_2$) gas, water vapor (a $H_2O$ gas), a nitric oxide (NO) gas, a nitrous oxide ($N_2O$) gas, a nitrogen dioxide ($NO_2$) gas, a carbon monoxide (CO) gas, a carbon dioxide ($CO_2$) gas, a $H_2+O_2$ gas, a $H_2+O_3$ gas or the like.

As the inert gas, in addition to the $N_2$ gas, it is possible to use, e.g., a rare gas such as an Ar gas, a He gas, a Ne gas, a Xe gas or the like.

(Performing the First Set a Predetermined Number of Times)

By performing one set (a first set) including aforementioned Steps 1 and 2 a predetermined number of times ($m_1$ times), namely by alternately performing Steps 1 and 2 once or more times, a C-free SiO film or a C-containing SiO film having a predetermined composition and a predetermined film thickness can be formed as a first film on the wafer 200. In the case of forming the C-containing SiO film as the first film, a C concentration in the first film is set to become lower than a C concentration in a second film which will be described later. At this time, the number of times of performing the first set is controlled such that the first film has a film thickness of, e.g., 0.1 nm or more and 5 nm or less, specifically 0.1 nm or more and 3 nm or less, more specifically 0.1 nm or more and 1 nm or less. The first set may be repeated a plurality of times within a range of, e.g., once or more and 50 times or less, specifically once or more and 30 times or less, more specifically once or more and 10 times or less. That is to say, the thickness of the second layer (the SiO layer or the C-containing SiO layer) formed when performing the first set once may be set smaller than a desired film thickness. The first set may be repeated a plurality of times until the film thickness of the first film becomes the desired film thickness.

(Step of Forming Second Film)

Next, the following two steps, i.e., Steps 3 and 4, are sequentially performed.

[Step 3]
(TCDMDS Gas Supply)

At this step, a TCDMDS gas is supplied to the wafer 200 disposed within the process chamber 201, namely the first film formed on the wafer 200.

The processing procedures and the processing conditions of this step are similar to the processing procedures and the processing conditions of Step 1 described above. Thus, a third layer, e.g., a Si-containing layer having a thickness of less than one atomic layer to several atomic layers and containing C and Cl, is formed on the first film (the SiO film or the C-containing SiO film) formed on the wafer 200.

(Residual Gas Removal)

After the third layer is formed, the supply of the TCDMDS gas is stopped by the processing procedures similar to those of Step 1. The TCDMDS gas remaining within the process chamber 201, which has not reacted or which has contributed to the formation of the first layer, is removed from the interior of the process chamber 201. At this time, similar to Step 1, the gas remaining within the process chamber 201 may not be completely removed.

As the precursor gas, in addition to the TCDMDS gas, it may be possible to use the various kinds of silane precursor gases illustrated at Step 1. As the inert gas, in addition to the $N_2$ gas, it may be possible to use the various kinds of rare gases illustrated at Step 1.

[Step 4]
(Supply of $O_3$ Gas)

After Step 3 is completed, a thermally-activated O3 gas is supplied to the wafer 200 disposed within the process chamber 201, namely the third layer formed on the first film, under second oxidation conditions.

The processing procedures of this step are similar to the processing procedures of Step 2 described above. Furthermore, the processing conditions of this step (the second oxidation conditions) may be appropriately selected from the conditions which fall within the range of the processing conditions (the first oxidation conditions) illustrated at Step 2. However, the second oxidation conditions are set to become different from the first oxidation conditions. That is to say, the second oxidation conditions are set to become the conditions under which at least a part of Si—C bonds contained in the third layer formed at Step 3 is maintained and the conditions under which a C concentration in a below-described fourth layer formed as a result of modification of the third layer is higher than a C concentration in the second layer formed as a result of modification of the first layer. In other words, the second oxidation conditions are set to become the conditions under which the oxidation power by the $O_3$ gas is weaker than that of the aforementioned first oxidation conditions.

For example, as illustrated in FIG. 4, the supply flow rate of the $O_3$ gas supplied under the second oxidation conditions is set smaller than the supply flow rate of the $O_3$ gas supplied under the first oxidation conditions. For example, as illustrated in FIG. 5, the supply time of the $O_3$ gas supplied under the second oxidation conditions is set shorter than the supply time of the $O_3$ gas supplied under the first oxidation conditions. For example, the concentration of the $O_3$ gas supplied under the second oxidation conditions is set lower than the concentration of the $O_3$ gas supplied under the first oxidation conditions. For example, the internal pressure of the process chamber 201 when supplying the $O_3$ gas under the second oxidation conditions is set lower than the internal pressure of the process chamber 201 when supplying the $O_3$ gas under the first oxidation conditions. For example, the partial pressure of the $O_3$ gas within the process chamber 201 when supplying the $O_3$ gas under the second oxidation conditions is set lower than the partial pressure of the $O_3$ gas within the process chamber 201 when supplying the $O_3$ gas under the first oxidation conditions. The various kinds of conditions mentioned above may be arbitrarily combined.

By supplying the $O_3$ gas to the wafer 200 under the aforementioned conditions (second oxidation conditions), it is possible to have the third layer formed on the wafer 200 react with the $O_3$ gas, thereby modifying (oxidizing) the third layer. At this time, an O component contained in the $O_3$ gas is added to the third layer, and a part of Si—C bonds contained in the third layer is maintained without being broken. By doing so, a layer containing Si, O and C, namely a C-containing SiO layer (C- and O-containing Si layer), may be formed as a fourth layer on the wafer 200. By performing the oxidation process under the aforementioned second oxidation conditions, it becomes easier to maintain the Si—C bonds contained in the third layer than when performing the oxidation process under the first oxidation conditions. Thus, desorption of C from the third layer is hardly generated. As a result, the C concentration in the fourth layer becomes higher than the C concentration in the second layer.

Similar to Step 2, during the formation of the fourth layer, impurities such as Cl or the like existing in the third layer are separated from the third layer. Thus, the fourth layer becomes a layer which is smaller in the amount of impurities such as Cl or the like than the third layer.

(Residual Gas Removal)

After the fourth layer is formed, the supply of the $O_3$ gas is stopped by the processing procedures similar to those of Step 2. The $O_3$ gas remaining within the process chamber 201, which has not reacted or which has contributed to the formation of the first layer, is removed from the interior of the process chamber 201. At this time, similar to Step 1, the gas remaining within the process chamber 201 may not be completely removed.

As the oxidizing gas, in addition to the $O_3$ gas, it may be possible to use the various kinds of O-containing gases illustrated at Step 2. As the inert gas, in addition to the $N_2$ gas, it may be possible to use the various kinds of rare gases illustrated at Step 2.

(Performing the Second Set a Predetermined Number of Times)

By performing one set (a second set) including aforementioned Steps 3 and 4 a predetermined number of times ($m_2$ times), namely by alternately performing Steps 3 and 4 once or more times, a C-containing SiO film having a predetermined composition and a predetermined film thickness can be formed as a second film on the first film (the SiO film or the C-containing SiO film). A C concentration in the second film is higher (larger) than a C concentration in the first film. At this time, the number of times of performing the second set is controlled such that the second film has a film thickness of, e.g., 0.1 nm or more and 5 nm or less, specifically 0.1 nm or more and 3 nm or less, more specifically 0.1 nm or more and 1 nm or less. Similar to the step of forming the first film, the second set may be repeated a plurality of times within a range of, e.g., once or more and 50 times or less, specifically once or more and 30 times or less, more specifically once or more and 10 times or less.

(Performing the Cycle a Predetermined Number of Times)

By performing, a predetermined number of times (n times), one cycle including the step of forming the first film and the step of forming the second film, namely by alternately performing, once or more times, the step of forming the first film and the step of forming the second film, it is possible to form, on the wafer 200, a laminated film (hereinafter often referred to as a nano laminate film) in which the first film (the SiO film or the C-containing SiO film) and the second film (the C-containing SiO film) are alternately laminated at a nano level.

By alternately switching the supply conditions of the $O_3$ gas between the first oxidation conditions and the second oxidation conditions differing from the first oxidation conditions each time when the step of forming the first film and the step of forming the second film is alternately performed, it is possible to form a laminated film in which the film (first film) having a relatively low in-film C concentration and the (second film) having a relatively high in-film C concentration are alternately laminated. In addition to the C-containing SiO film, a C-free SiO film is also included in the film (first film) having a relatively low in-film C concentration. That is to say, not only the film having a C concentration lower than the C concentration in the second film but also a film having a C concentration of an impurity level or a film having a C concentration of substantially zero is also included in the film (first film) having a relatively low in-film C concentration. This holds true in the following descriptions. The laminated film as a whole becomes a film containing Si, O and C, namely a C-containing SiO film.

(Purge and Return to Atmospheric Pressure)

After the formation of the laminated film is completed, the valves 243d and 243e are opened. The $N_2$ gas is supplied into the process chamber 201 from each of the gas supply pipes 232d and 232e, and is exhausted through the exhaust pipe 231. The $N_2$ gas serves as a purge gas. Thus, the interior of the process chamber 201 is purged, and residual gas or the reaction byproduct remaining within the process chamber 201 is removed from the interior of the process chamber 201 (purge). Thereafter, the internal atmosphere of the process chamber 201 is substituted with an inert gas (inert gas substitution), and the internal pressure of the process chamber 201 is returned to atmospheric pressure (return to atmospheric pressure).

(Boat Unloading and Wafer Discharge)

The seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unloading). Thereafter, the processed wafers 200 are discharged from the boat 217 (wafer discharge).

(3) Effects According to the Present Embodiment

According to the present embodiment, one or more effects may be achieved, as follows.

(a) By alternately laminating the first film having a relatively low in-film C concentration and the second film having a relatively high in-film C concentration, it is possible to improve the surface roughness of the finally-formed laminated film (the C-containing SiO film).

As used herein, the term "surface roughness" means the height difference in a wafer surface or in an arbitrary object surface. The surface roughness has the same meaning as the surface coarseness. By stating that the surface roughness is improved (good), it is meant that the height difference is reduced (small), namely that the surface is smoothened (smooth). By stating that the surface roughness is worsened (poor), it is meant that the height difference is increased (large), namely that the surface is roughened (rough).

There is a tendency that the first film having a relatively low in-film C concentration becomes better in surface roughness than the second film having a relatively high in-film C concentration. For that reason, by alternately laminating the first film and the second film, it becomes possible to improve the surface roughness of the finally-formed laminated film. That is to say, by alternately laminating the first film and the second film, as compared with a case where a single SiOC film is formed by laminating only the second film, it becomes possible to improve the surface roughness of the finally-formed laminated film.

At this time, if the formation of the first film having a relatively low in-film C concentration is performed prior to the formation of the second film having a relatively high in-film C concentration, it is possible to further improve the surface roughness of the finally-formed laminated film. That is to say, if the first film having good surface roughness is formed as a base of the second film prior to forming the second film and if the second film is formed on the first film, the second film is affected by the base. This makes it possible to improve the surface roughness of the second film. As a result, it becomes possible to further improve the surface roughness of the finally-formed laminated film.

Furthermore, at this time, if the first film having a relatively low in-film C concentration is formed lastly, it becomes possible to further improve the surface roughness of the finally-formed laminated film. That is to say, if the uppermost portion of the finally-formed laminated film is configured by the first film having good surface roughness, it becomes possible to further improve the surface roughness of the finally-formed laminated film.

(b) By alternately laminating the first film having a relatively low in-film C concentration and the second film having a relatively high in-film C concentration, it becomes possible to improve a resistance to hydrogen fluoride (HF), i.e., an etching resistance, of the finally-formed laminated film.

The second film having a relatively high in-film C concentration is higher in etching resistance than a C-free SiO film or a SiO film having a low in-film C concentration. For that reason, by alternately laminating the first film and the second film, the etching resistance of the finally-formed laminated film can be controlled so as to have, e.g., an arbitrary characteristic between the first film and the second film. That is to say, by alternately laminating the first film and the second film, the etching resistance of the finally-formed laminated film can be set to have a characteristic which is unrealizable in a case where a single film is formed by laminating only the first film (the second layer) or a case where a single film is formed by laminating only the second film (the fourth layer). That is to say, it is possible to expand the window of control of the etching resistance.

(c) By alternately laminating the first film and the second film as described above, it is possible to have the finally-formed laminated film become a film having a characteristic of one or both of the first film and the second film, a film having an intermediate characteristic of the first film and the second film, or a film having a characteristic differing from the characteristic of the first film or the second film. In these cases, as described above, each of the first film and the second film may have a film thickness of, e.g., 0.1 nm or more and 5 nm or less, specifically 0.1 nm or more and 3 nm or less, more specifically 0.1 nm or more and 1 nm or less.

It is difficult to set the thickness of the first film and the second film at a thickness of less than 0.1 nm. Furthermore, if the thickness of one of the first film and the second film is set at a thickness of more than 5 nm, there may be a case where the finally-formed laminated film becomes a film having non-uniform (inconsistent) characteristics in the lamination direction, namely a film whose characteristics are made distinct in the lamination direction due to the mere lamination of the first film and the second film. By setting the thickness of the first film and the second film at 0.1 nm or more and 5 nm or less, specifically 0.1 nm or more and 3 nm or less, more specifically 0.1 nm or more and 1 nm or less, it is possible to have the finally-formed laminated film become a film having consistent characteristics in the lamination direction, namely a film in which the characteristics and properties of the first film and the second film are properly fused. By setting the thickness of each of the first film and the second film at a thickness of 3 nm or less, it is possible to obtain a laminated film in which the characteristics and properties of the first film and the second film are sufficiently fused. By setting the thickness of each of the first film and the second film at a thickness of 1 nm or less, it is possible to obtain a laminated film in which the characteristics and properties of the first film and the second film are surely fused. That is to say, by setting the thickness of the first film and the second film at a thickness which falls within the aforementioned range, it is possible to have the finally-formed laminated film become a nano laminate film having integral and inseparable characteristics in the film as a whole. In addition, if the number of times of performing each of the aforementioned sets ($m_1$ times or $m_2$ times) is set at once or more and 50 times or less, specifically once or more and 30 times or less, more specifically once or more and 10 times or less, it is possible to set the thickness of the first film and the second film at a thickness which falls within the aforementioned range. In addition, if the thickness of the first film and the second film is set to become smaller, namely if the number of times of performing each of the aforementioned sets ($m_1$ times or $m_2$ times) is set to become smaller, it is possible to improve the surface roughness of the finally-formed laminated film.

(d) When forming the first film and the second film, by non-simultaneously performing the supply steps of different gases without synchronizing them, it is possible to allow the gases to appropriately contribute to a reaction under a condition in which a gas phase reaction or a surface reaction is properly generated. Consequently, it is possible to improve the step coverage of the finally-formed laminated film and the controllability of the film thickness. In addition, it is possible to avoid generation of an excessive gas phase reaction within the process chamber 201 and to suppress generation of particles.

(e) The aforementioned effects may be similarly achieved even when a gas other than the TCDMDS gas is used as the precursor gas or when an O-containing gas other than the $O_3$ gas is used as the oxidizing gas.

(4) Modifications

The film forming sequence according to the present embodiment is not limited to the form illustrated in FIGS. 4 and 5 but may be modified as in the modifications which will be described below.

Modification 1

Figure 6:
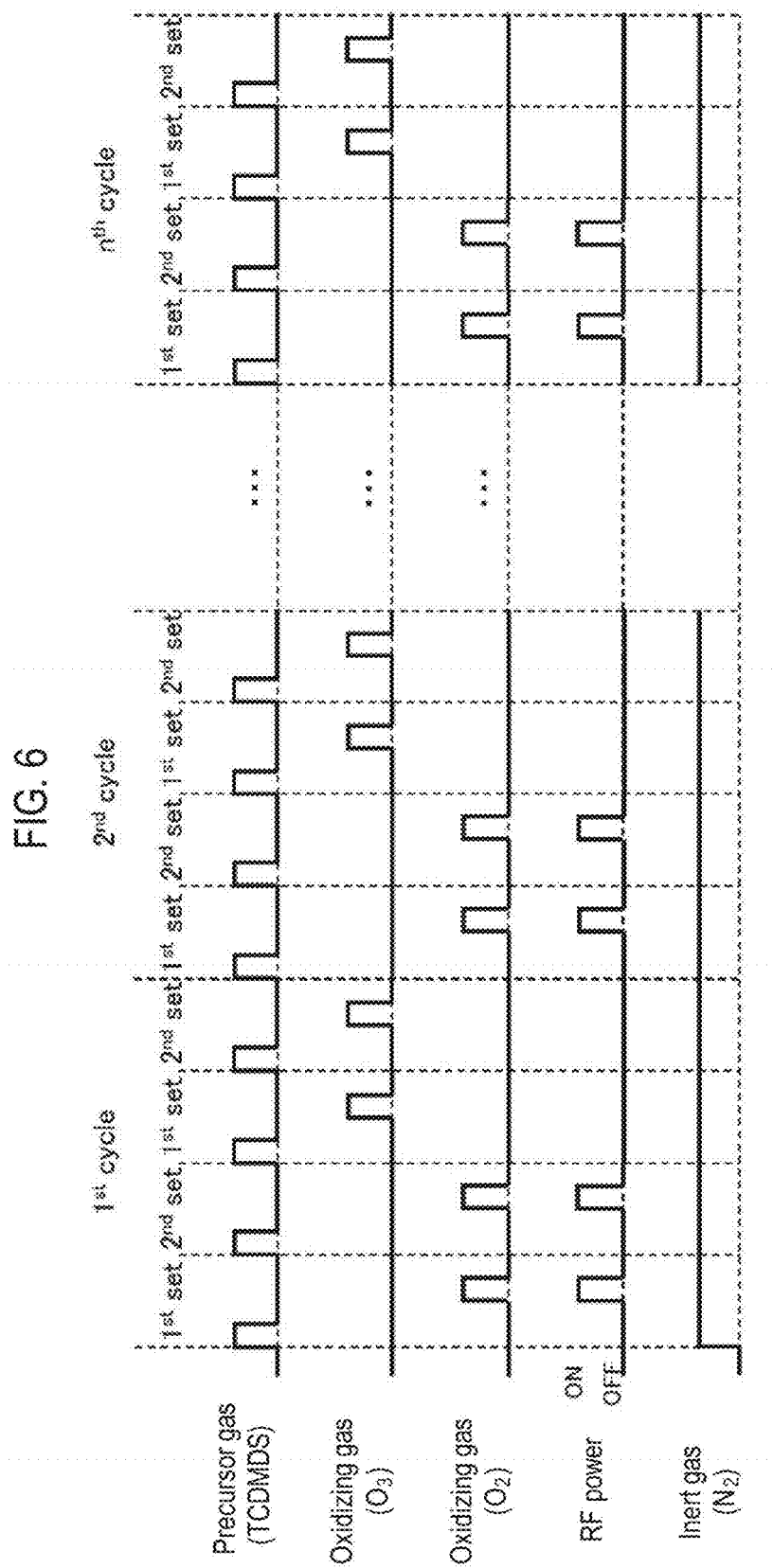
FIG. 6 is a view illustrating gas supply timings in modification 1 of the film forming sequence according to one embodiment of the present disclosure.

As illustrated in FIG. 6, at Step 2, an $O_2$ gas as an oxidizing gas may be plasma-excited and supplied to the wafer 200. At Step 4, an $O_2$ gas as an oxidizing gas may be supplied to the wafer 200 without plasma-exciting the same. By making the kinds of the oxidizing gas used at Steps 2 and 4 differ from each other in this way, it is possible to make the processing conditions of Step 2 (the first oxidation conditions) and the processing conditions of Step 4 (the second oxidation conditions) differ from each other. FIG. 6 illustrates an example in which each of the first set and the second set is performed twice and in which the cycle including the step of forming the first film and the step of forming the second film is repeated n times.

Even with modification 1, it is possible to achieve the effects similar to those of the film forming sequence illustrated in FIGS. 4 and 5. In the subject specification, for the sake of convenience, the film forming sequence of modification 1 may be represented as follows.

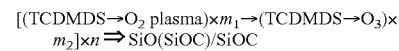

Modification 2

Figure 7:
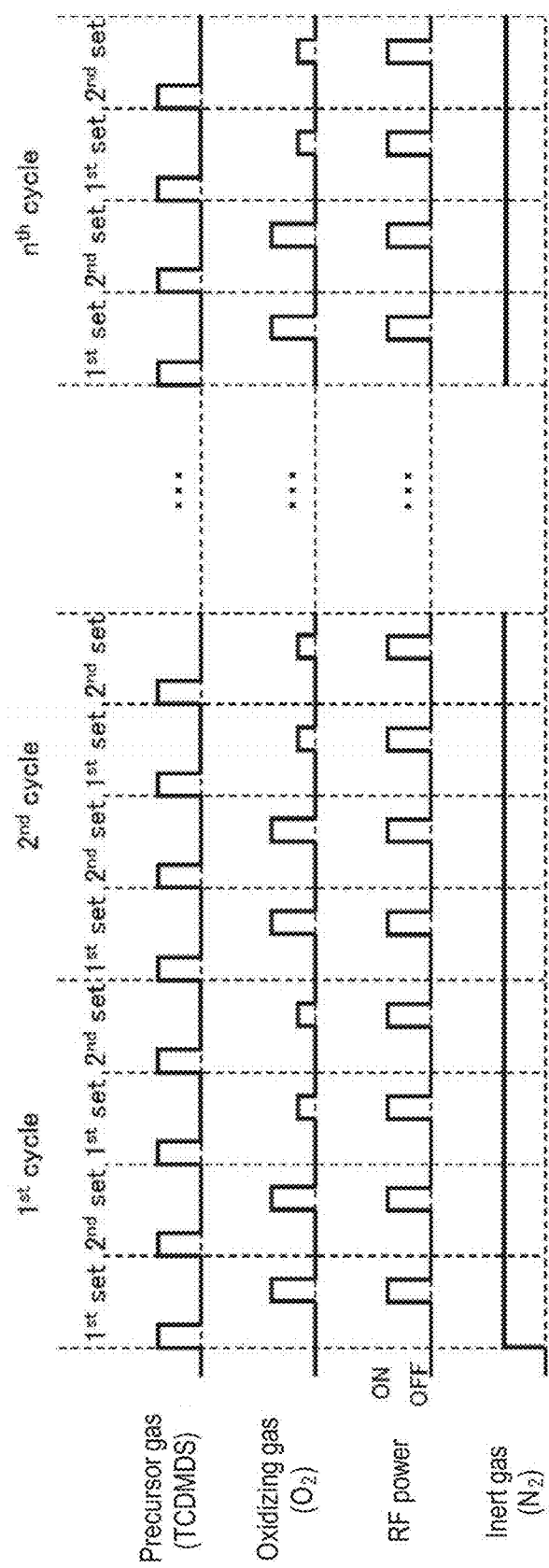
FIG. 7 is a view illustrating gas supply timings in modification 2 of the film forming sequence according to one embodiment of the present disclosure.

As illustrated in FIG. 7, at Steps 2 and 4, an $O_2$ gas as an oxidizing gas may be plasma-excited and supplied to the wafer 200. At this time, by making the supply flow rate of the $O_2$ gas at Step 2 larger than the supply flow rate of the $O_2$ gas at Step 4, it is possible to make the processing conditions of Step 2 (the first oxidation conditions) and the processing conditions of Step 4 (the second oxidation conditions) differ from each other. At Steps 2 and 4, instead of making different the supply flow rate of the $O_2$ gas, it may be possible to make different the supply time of the $O_2$ gas, the concentration of the $O_2$ gas, the internal pressure of the process chamber 201, or the partial pressure of the $O_2$ gas within the process chamber 201 as in the film forming sequence illustrated in FIGS. 4 and 5. By making the supply amount of RF power applied to between the rod-shaped electrodes 269 and 270 at Step 2 larger than that of Step 4, it may be possible to make the processing conditions of Step 2 (the first oxidation conditions) and the processing conditions of Step 4 (the second oxidation conditions) differ from each other. These methods may be arbitrarily combined. FIG. 7 illustrates an example in which each of the first set and the second set is performed twice and in which the cycle including the step of forming the first film and the step of forming the second film is repeated n times.

Even with modification 2, it is possible to achieve the effects similar to those of the film forming sequence illustrated in FIGS. 4 and 5. In the subject specification, for the sake of convenience, the film forming sequence of modification 2 may be represented as follows.

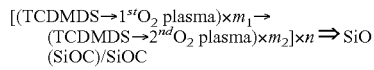
$[(\text{TCDMDS} \rightarrow 1^{st}O_2 \text{ plasma}) \times m_1 \rightarrow (\text{TCDMDS} \rightarrow 2^{nd}O_2 \text{ plasma}) \times m_2] \times n \Rightarrow \text{SiO(SiOC)/SiOC}$

Modification 3

Figure 8:
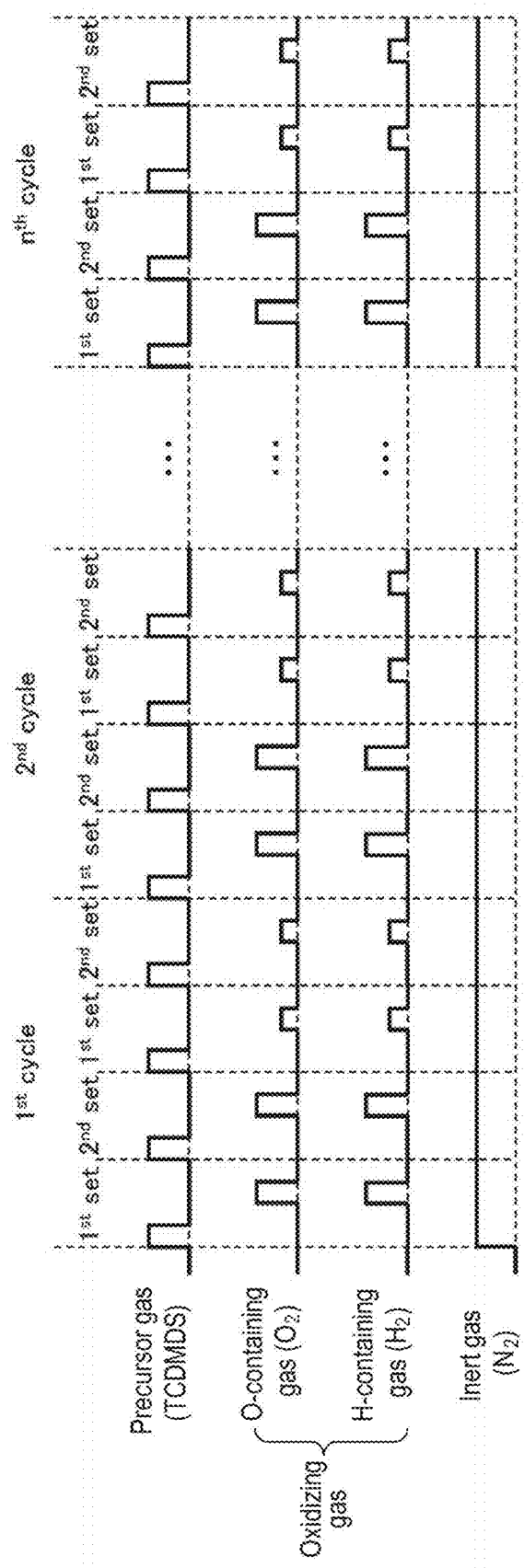
FIG. 8 is a view illustrating gas supply timings in modification 3 of the film forming sequence according to one embodiment of the present disclosure.

As illustrated in FIG. 8, at Steps 2 and 4, an $O_2$ gas as an oxidizing gas and a $H_2$ gas may be supplied to the wafer 200. In this case, the $O_2$ gas and the $H_2$ gas are allowed to react with each other under the first oxidation conditions or the second oxidation conditions, thereby generating oxidizing species (also referred to as reactive species) which contain atomic oxygen (O) and which do not contain moisture ($H_2O$). The oxidizing species which contain atomic oxygen are supplied to the wafer 200. This makes it possible to perform an oxidation process of the first layer or the third layer. FIG. 8 illustrates an example in which each of the first set and the second set is performed twice and in which the cycle including the step of forming the first film and the step of forming the second film is repeated n times.

At this time, by making the supply flow rate of each of the $O_2$ gas and the $H_2$ gas at Step 2 larger than the supply flow rate of each of the $O_2$ gas and the $H_2$ gas at Step 4, it is possible to make the processing conditions of Step 2 (the first oxidation conditions) and the processing conditions of Step 4 (the second oxidation conditions) differ from each other. At Steps 2 and 4, instead of making different the supply flow rate of each of the $O_2$ gas and the $H_2$ gas, it may be possible to make different the supply time of each of the $O_2$ gas and the $H_2$ gas, the concentration of each of the $O_2$ gas and the $H_2$ gas, the internal pressure of the process chamber 201, or the partial pressure of each of the $O_2$ gas and the $H_2$ gas within the process chamber 201 as in the film forming sequence illustrated in FIGS. 4 and 5. As described above, the supply conditions may be made different only for one of the $O_2$ gas and the $H_2$ gas. These methods may be arbitrarily combined.

Even with modification 3, it is possible to achieve the effects similar to those of the film forming sequence illustrated in FIGS. 4 and 5. In the subject specification, for the sake of convenience, the film forming sequence of modification 3 may be represented as follows.

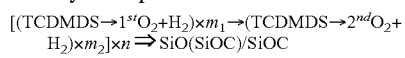
$[(\text{TCDMDS} \rightarrow 1^{st}O_2 + H_2) \times m_1 \rightarrow (\text{TCDMDS} \rightarrow 2^{nd}O_2 + H_2) \times m_2] \times n \Rightarrow \text{SiO(SiOC)/SiOC}$

Modifications 4 to 8

For example, a laminated film composed of a first film and a second film alternately laminated one above another may be formed on the wafer 200 by the following film forming sequences (modifications 4 to 8 in order). At this time, the processing conditions of Step 2 (the first oxidation conditions) and the processing conditions of Step 4 (the second oxidation conditions) may be made different by arbitrarily combining the method of the film forming sequence illustrated in FIGS. 4 and 5 and the methods of the modifications described above. Even with modification 3, it is possible to achieve the effects similar to those of the film forming sequence illustrated in FIGS. 4 and 5.

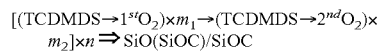
$[(\text{TCDMDS} \rightarrow 1^{st}O_2) \times m_1 \rightarrow (\text{TCDMDS} \rightarrow 2^{nd}O_2) \times m_2] \times n \Rightarrow \text{SiO(SiOC)/SiOC}$

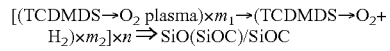
$[(\text{TCDMDS} \rightarrow O_2 \text{ plasma}) \times m_1 \rightarrow (\text{TCDMDS} \rightarrow O_2 + H_2) \times m_2] \times n \Rightarrow \text{SiO(SiOC)/SiOC}$

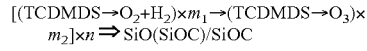
$[(\text{TCDMDS} \rightarrow O_2 + H_2) \times m_1 \rightarrow (\text{TCDMDS} \rightarrow O_3) \times m_2] \times n \Rightarrow \text{SiO(SiOC)/SiOC}$

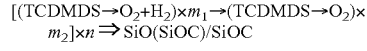
$[(\text{TCDMDS} \rightarrow O_2 + H_2) \times m_1 \rightarrow (\text{TCDMDS} \rightarrow O_2) \times m_2] \times n \Rightarrow \text{SiO(SiOC)/SiOC}$

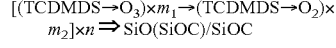
$[(\text{TCDMDS} \rightarrow O_3) \times m_1 \rightarrow (\text{TCDMDS} \rightarrow O_2) \times m_2] \times n \Rightarrow \text{SiO(SiOC)/SiOC}$

Modification 9

In the film forming sequence illustrated in FIGS. 4 and 5 and the respective modifications described above, for example, at the step of forming the second film, a C-containing gas such as a $C_3H_6$ gas or the like may be supplied simultaneously with a precursor gas such as a TCDMDS gas or the like, or simultaneously with an oxidizing gas such as an $O_3$ gas or the like. That is to say, a step of supplying a $C_3H_6$ gas may be performed simultaneously with at least one of the steps of supplying the precursor gases and the steps of supplying the oxidizing gases.

According to this modification, the same effects as those of the film forming sequence illustrated in FIGS. 4 and 5 and those of the respective modifications described above may be achieved. In addition, according to this modification, the C component contained in the $C_3H_6$ gas can be added to the finally-formed film. This makes it possible to further increase the C concentration in the finally-formed film. However, the $C_3H_6$ gas may be supplied simultaneously with the oxidizing gas rather than supplying the $C_3H_6$ gas simultaneously with the precursor gas. By doing so, it is possible to avoid an excessive gas phase reaction within the process chamber 201 and to suppress generation of particles within the process chamber 201. The supply of the C-containing gas may be performed not only at the step of forming the second film but also at the step of forming the first film.

Modification 10

The kind of the precursor gas supplied at the step of forming the first film may differ from the kind of the precursor gas supplied at the step of forming the second film. That is to say, at the step of forming the first film, it may be possible to supply a precursor gas which differs in molecular structure from the precursor gas supplied at the step of forming the second film.

For example, at the step of forming the first film, a C-free inorganic silane precursor gas such as, e.g., a hexachlorodisilane ($Si_2Cl_6$, abbreviation: HCDS) gas or a dichlorosilane ($SiH_2Cl_2$, abbreviation: DCS) gas, may be used as the precursor gas. At the step of forming the second film, a precursor gas containing Si and C and having Si—C bonds, such as a TCDMDS gas or the like, may be used as the precursor gas.

For example, at the step of forming the second film, it may be possible to use, as the precursor gas, a gas in which the number of Si—C bonds contained in one molecule is larger than the number of Si—C bonds contained in one molecule of the precursor gas supplied at the step of forming the first film. For example, at the step of forming the second film, it may be possible to use, as the precursor gas, an MCPMDS gas in which the number of Si—C bonds contained in one molecule is five. At the step of forming the first film, it may be possible to use, as the precursor gas, a TCDMDS gas which the number of Si—C bonds contained in one molecule is two.

According to this modification, the same effects as those of the film forming sequence illustrated in FIGS. 4 and 5 and those of the respective modifications described above may be achieved. In addition, according to this modification, even if the processing conditions of Step 2 (the first oxidation conditions) and the processing conditions of Step 4 (the second oxidation conditions) are not made different, it is possible to achieve the same effects as those of the film forming sequence illustrated in FIGS. 4 and 5 and those of the respective modifications described above.

(Processing Procedures and Processing Conditions)

At the step of activating the oxidizing gas with plasma and supplying the activated oxidizing gas to the wafer 200, the supply flow rate of the oxidizing gas controlled by the MFC 241b is set to fall within a range of, e.g., 100 to 10,000 sccm. The RF power applied to between the rod-shaped electrodes 269 and 270 is set to fall within a range of, e.g., 50 to 1,000 W. The internal pressure of the process chamber 201 is set to fall within a range of, e.g., 1 to 500 Pa, specifically 1 to 100 Pa. The partial pressure of the oxidizing gas within the process chamber 201 is set to fall within a range of, e.g., 0.01 to 495 Pa, specifically 0.01 to 99 Pa. By using the plasma, it becomes possible to activate the oxidizing gas even when the internal pressure of the process chamber 201 is set to fall within such a relatively low pressure zone. Other processing conditions may be similar to, e.g., the processing conditions of Step 2 or Step 4 of the film forming sequence illustrated in FIGS. 4 and 5.

At the step of supplying the $O_2$ gas and the $H_2$ gas to the wafer 200, each of the supply flow rate of the $O_2$ gas controlled by the MFC 241b and the supply flow rate of the $H_2$ gas controlled by the MFC 241c is set to fall within a range of, e.g., 100 to 10,000 sccm. The internal pressure of the process chamber 201 is set to fall within a range of less than the atmosphere pressure, e.g., 1 to 1,330 Pa. The time period for supplying the $O_2$ gas and the $H_2$ gas to the wafer 200, namely the gas supply time (irradiation time), is set to fall within a range of, e.g., 1 to 120 seconds, specifically 1 to 60 seconds. Other processing conditions may be similar to, e.g., the processing conditions of Step 2 or Step 4 of the film forming sequence illustrated in FIGS. 4 and 5. As the O-containing gas, it may be possible to use an $O_2$ gas, a $N_2O$ gas, a NO gas, a $NO_2$ gas, an $O_3$ gas, a $H_2O$ gas, a CO gas, a $CO_2$ gas or the like. As the H-containing gas, it may be possible to use a $H_2$ gas, a deuterium ($D_2$) gas or the like.

At the step of supplying the $C_3H_6$ gas to the wafer 200, the supply flow rate of the $C_3H_6$ gas controlled by the MFC 241b is set to fall within a range of, e.g., 100 to 10,000 sccm. The partial pressure of the $C_3H_6$ gas within the process chamber 201 is set to fall within a range of, e.g., 0.01 to 3,960 Pa. Other processing conditions may be similar to, e.g., the processing conditions of Step 2 or Step 4 of the film forming sequence illustrated in FIGS. 4 and 5. As the C-containing gas, in addition to the $C_3H_6$ gas, it may be possible to use, e.g., a hydrocarbon-based gas such as an acetylene ($C_2H_2$) gas, an ethylene ($C_2H_4$) gas or the like.

Other Embodiments of the Present Disclosure

One embodiment of the present disclosure has been described above. However, the present disclosure is not limited to the aforementioned embodiment but may be differently modified without departing from the spirit of the present disclosure.

For example, in the above-described embodiment, there has been described an example in which the cycle that non-simultaneously performs the step of forming the first film having a relatively low in-film C concentration and the step of forming the second film having a relatively high in-film C concentration in the named order is performed a predetermined number of times. The present disclosure is not limited to this form. The order of forming the first film and the second film may be reversed. That is to say, a cycle that non-simultaneously performs the step of forming the second film and the step of forming the first film in the named order may be performed a predetermined number of times. However, if the first film is initially formed as described above, it is possible to improve the surface roughness of the finally-formed laminated film. In addition, if the first film is lastly formed, it is possible to improve the surface roughness of the finally-formed laminated film.

For example, in the above-described embodiment, there has been described an example in which, when forming the first film and the second film, the oxidizing gas is supplied after supplying the precursor gas. The present disclosure is not limited thereto. The supply order of the precursor gas and the oxidizing gas may be reversed. That is to say, when forming at least one of the first film and the second film, the precursor gas may be supplied after the supply of the oxidizing gas. By changing the supply order of the precursor gas and the oxidizing gas, it is possible to change the quality or the composition ratio of the thin film thus formed.

For example, in the above-described embodiment, there has been described an example in which, when forming the first film and the second film, the supply of the precursor gas and the supply of the oxidizing gas are alternately performed. The present disclosure is not limited thereto. The supply of the precursor gas and the supply of the oxidizing gas may be simultaneously performed. That is to say, when forming at least one of the first film and the second film, the step of supplying the precursor gas to the wafer 200 and the step of supplying the oxidizing gas to the wafer 200 may be simultaneously performed. However, it is desirable to alternately perform the supply of the precursor gas and the supply of the oxidizing gas. By doing so, it is possible to suppress generation of particles within the process chamber 201 and to improve the step coverage and the film thickness controllability of the film thus formed.

If the silicon-based insulating film formed by the method of the film forming sequence illustrated in FIGS. 4 and 5 or methods of the modifications described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to the film forming sequence illustrated in FIGS. 4 and 5 or some of the modifications described above, it is possible to form a silicon-based insulating film having an ideal stoichiometric ratio without having to use plasma. Since the silicon-based insulating film can be formed without having to use plasma, it is possible to adapt the present disclosure to a process for forming, e.g., a SADP film of a DPT, in which plasma damage is about a concern.

The film forming sequence described above may be appropriately applied to a case where an oxycarbide film, namely a C-containing metal-based oxide film, which contains a metal element such as titanium (Ti), zirconium (Zr), hafnium (Hf), tantalum (Ta), niobium (Nb), aluminum (Al), molybdenum (Mo), tungsten (W) or the like is formed. That is to say, the present disclosure may be appropriately applied to a case where a C-containing metal-based oxide film such as, e.g., a TiOC film, a ZrOC film, a HfOC film, a TaOC film, a NbOC film, an AlOC film, a MoOC film or a WOC film, is formed In these cases, instead of the precursor gas containing a semiconductor element such as Si or the like used in the above-described embodiment, a precursor gas containing a metal element may be used as the precursor gas. As the oxidizing gas, it may be possible to use the same gases as those used in the above-described embodiment. The processing procedures and the processing conditions used at this time may be similar to, e.g., the processing procedures and the processing conditions of the above-described embodiment.

That is to say, the present disclosure may be suitably applied to a case where an oxide film containing a predetermined element such as a semiconductor element, a metal element or the like and containing C is formed.

Process recipes (e.g., programs describing substrate processing procedures and substrate processing conditions) used in forming these various kinds of films may be prepared individually (in a plural number) according to the contents of substrate processing (e.g., the kind, composition ratio, quality, thickness, processing procedure and processing condition of the film to be formed). In addition, at the start of the substrate processing, an appropriate recipe may be properly selected from the recipes according to the substrate processing contents. Specifically, the recipes individually prepared according to the substrate processing contents may be stored (or installed) in advance in the memory device 121c of the substrate processing apparatus via a telecommunication line or a recording medium (e.g., the external memory device 123) storing the recipes. Moreover, at the start of the substrate processing, the CPU 121a of the substrate processing apparatus may properly select an appropriate recipe from the recipes stored in the memory device 121c according to the substrate processing contents. This configuration enables a single substrate processing apparatus to form films of different kinds, composition ratios, qualities and thicknesses for general purposes and with enhanced reproducibility. In addition, this configuration makes it possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing procedures and the processing conditions may be similar to, e.g., those of the aforementioned embodiment.

Figure 12A:
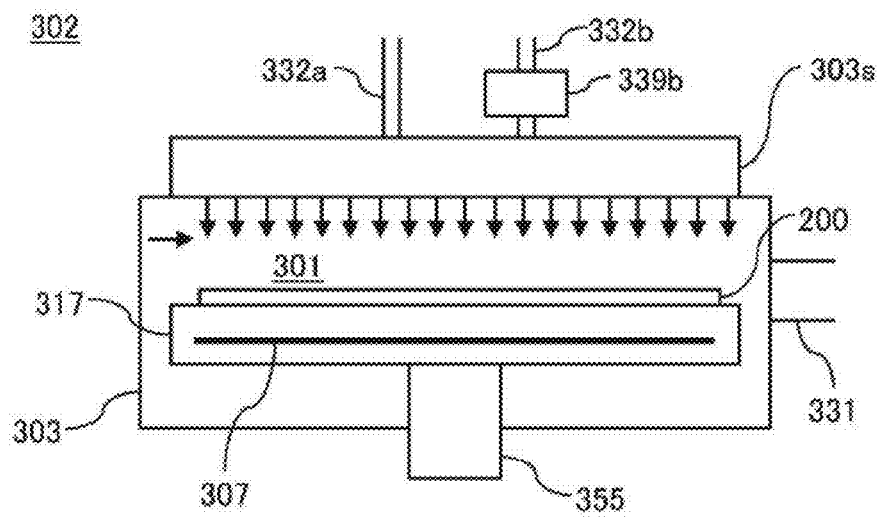
FIG. 12A is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 12A. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor gas and a gas supply port 332b configured to the supply the aforementioned oxidizing gas are connected to inlets (gas introduction holes) of the shower head 303s. A gas supply system identical with the precursor gas supply system of the aforementioned embodiment is connected to the gas supply port 332a. A remote plasma unit (or a plasma generating device) 339b as an exciting part configured to supply the aforementioned oxidizing gas by plasma-exciting the same and a gas supply system identical with the oxidizing gas supply system of the aforementioned embodiment are connected to the gas supply port 332b. A gas distribution plate configured to supply a gas into the process chamber 301 in a shower-like manner is installed in outlets (gas discharge holes) of the shower head 303s. The shower head 303s is installed at such a position as to face the surfaces of the wafers 200 carried into the process chamber 301. An exhaust port 331 configured to evacuate the interior of the process chamber 301 is installed in the process vessel 303. An exhaust system identical with the exhaust system of the aforementioned embodiment is connected to the exhaust port 331.

Figure 12B:
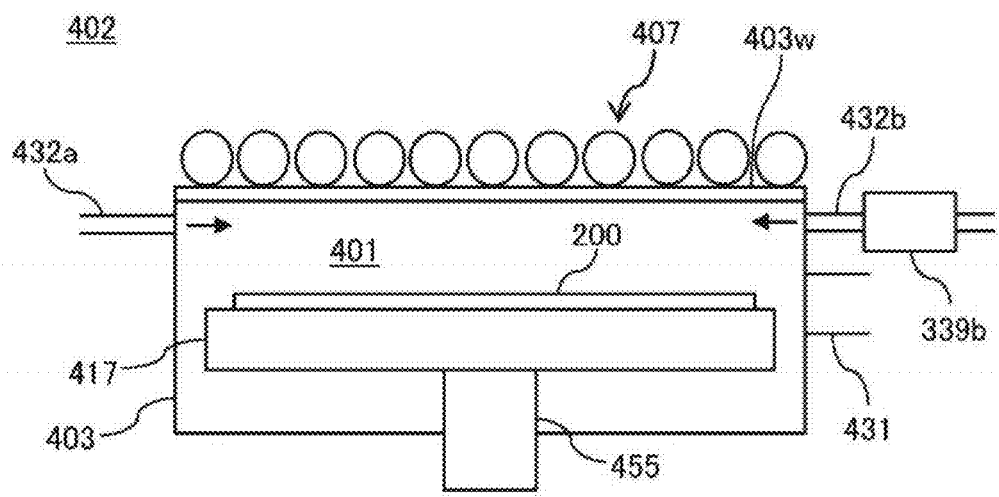
FIG. 12B is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 12B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a configured to supply the aforementioned precursor gas and a gas supply port 432b configured to supply the aforementioned oxidizing gas are connected to the process vessel 403. A gas supply system identical with the precursor gas supply system of the aforementioned embodiment is connected to the gas supply port 432a. The aforementioned remote plasma unit 339b and the gas supply system identical with the oxidizing gas supply system of the aforementioned embodiment are connected to the gas supply port 432b. The gas supply ports 432a and 432b are respectively installed at the lateral side of the end portions of the wafers 200 carried into the process chamber 401, namely at such positions as not to face the surfaces of the wafers 200 carried into the process chamber 40. An exhaust port 431 configured to evacuate the interior of the process chamber 401 is installed in the process vessel 403. An exhaust system identical with the exhaust system of the aforementioned embodiment is connected to the exhaust port 431.

In the case of using these substrate processing apparatuses, film formation can be performed by the same sequences and processing conditions as those of the embodiments and modifications described above.

The embodiments and modifications described above may be appropriately combined with one another. In addition, the processing conditions used at this time may be the same as, e.g., the processing conditions of the embodiments described above.

Example

Next, descriptions will be made on the experimental results that support the effects achieved in the embodiment and modifications described above.
(Evaluation on Etching Resistance)

In this evaluation, as Sample 1, a C-containing SiO film was formed on a wafer by performing, a predetermined number of times, a cycle that non-simultaneously performs a step of supplying a TCDMDS gas to a wafer disposed within a process chamber and a step of supplying a thermally-activated $O_3$ gas to the wafer disposed within the process chamber, using the substrate processing apparatus of the aforementioned embodiment. Processing conditions were set to fall within a range of the processing conditions described in the aforementioned embodiment. In addition, the concentration of the $O_3$ gas was set to become higher than the concentration of the $O_3$ gas used when preparing Sample 2 which will be described later.

As Sample 2, a C-containing SiO film was formed on a wafer by the same processing procedures as the processing procedures of Sample 1 using the substrate processing apparatus of the aforementioned embodiment. The concentration of the $O_3$ gas was set to become lower than the concentration of the $O_3$ gas used when preparing Sample 1. Other processing conditions are similar to the processing conditions used when forming Sample 1.

By allowing the concentration of the $O_3$ gas, namely the processing conditions (the oxidation conditions) during the supply of the oxidizing gas, to become different in Sample 1 and Sample 2 as mentioned above, the C-containing SiO film formed as Sample 2 became a film which is higher in in-film C concentration than the C-containing SiO film formed as Sample 1. Thereafter, the etching resistance of the C-containing SiO films formed as Samples 1 and 2 was measured.

FIG. 9 is a graph illustrating etching rates (wet etching rates) when the C-containing SiO films formed as Samples 1 and 2 are etched using an aqueous HF solution having a HF concentration of 1%. The vertical axis in FIG. 9 indicates an etching rate [Å/min]. According to FIG. 9, it can be noted that the etching rate (34.9 [Å/min]) of the C-containing SiO film as Sample 2 is less than $\frac{1}{13}$ of the etching rate (480.8 [Å/min]) of the C-containing SiO film as Sample 1. That is to say, it can be appreciated that the C-containing SiO film of Sample 2 having a relatively high in-film C concentration is higher in resistance to HF than the C-containing SiO film of Sample 1 having a relatively low in-film C concentration. The present inventors confirmed that the etching resistance of a finally-formed laminated film can be improved by alternately laminating the SiO film having a relatively low in-film C concentration and the SiO film having a relatively high in-film C concentration.
(Evaluation on Surface Roughness)

In this evaluation, as Sample 3, a C-containing SiO film was formed on a wafer by the same processing procedures as the processing procedures of Sample 1 using the substrate processing apparatus of the aforementioned embodiment. Processing conditions were set to fall within a range of the processing conditions described in the aforementioned embodiment.

As Sample 4, a C-containing SiO film was formed on a wafer by performing, a predetermined number of times, a cycle that non-simultaneously performs a step of supplying a TCDMDS gas to a wafer disposed within a process chamber and a step of supplying a plasma-excited $O_2$ gas to the wafer disposed within the process chamber, using the substrate processing apparatus of the aforementioned embodiment. Processing conditions were set to fall within a range of the processing conditions described in the aforementioned embodiment.

By allowing the processing conditions (the oxidation conditions) during the supply of the oxidizing gas to become different in Sample 3 and Sample 4 as mentioned above, the C-containing SiO film formed as Sample 4 became a film which is lower in in-film C concentration than the C-containing SiO film formed as Sample 3. Thereafter, the surface roughness of the C-containing SiO films formed as Samples 3 and 4 was measured.

FIG. 10 is a graph illustrating surface roughness of the SiOC films formed as Samples 3 and 4. The vertical axis in FIG. 10 indicates surface roughness [nm]. According to FIG. 10, it can be noted that the surface roughness (0.09 [nm]) of the C-containing SiO film as Sample 4 is less than $\frac{1}{7}$ of the surface roughness (0.67 [nm]) of the C-containing SiO film as Sample 3. That is to say, it can be appreciated that the C-containing SiO film of Sample 4 having a relatively low in-film C concentration is better in surface roughness than the C-containing SiO film of Sample 3 having a relatively high in-film C concentration. The present inventors confirmed that the surface roughness of a finally-formed laminated film can be improved by alternately laminating the SiO film having a relatively low in-film C concentration and the SiO film having a relatively high in-film C concentration.

Aspects of Present Disclosure

Hereinafter, some aspects of the present disclosure are additionally described as supplementary notes.

Supplementary Note 1

According to one aspect of the present disclosure, there is provided a method of manufacturing a semiconductor device or a substrate processing method, including forming a laminated film on a substrate by performing a cycle a predetermined number of times (n times), the cycle including: forming a first film which contains at least a predetermined element and oxygen; and forming a second film which contains at least the predetermined element, oxygen and carbon, wherein the first film and the second film are laminated to form the laminated film.

Supplementary Note 2

In the method of Supplementary Note 1, the first film may be carbon-free or may further contain carbon, and a concentration of carbon in the first film may be lower than a concentration of carbon in the second film.

Supplementary Note 3

In the method of Supplementary Note 1 or 2, wherein forming the first film may include performing a first set a first preset number of times ($m_1$ times), the first set including: supplying a first precursor gas containing the predetermined element and carbon and having chemical bonds between the predetermined element and carbon to the substrate; and supplying a first oxidizing gas to the substrate under a first oxidation condition. Further, forming the second film may include performing a second set a second preset number of times ($m_2$ times or more), the second set including: supplying a second precursor gas containing the predetermined element and carbon and having chemical bonds between the predetermined element and carbon to the substrate; and supplying a second oxidizing gas to the substrate under a second oxidation condition, the second oxidation condition being different from the first oxidation condition.

That is to say, in the method of Supplementary Note 1 or 2, a cycle that includes supplying a precursor gas containing the predetermined element and carbon and having chemical bonds between the predetermined element and carbon to the substrate and supplying an oxidizing gas to the substrate may be performed a predetermined number of times (a plurality of time, i.e., twice or more). The laminated film may be formed by alternately switching supply conditions of the oxidizing gas between the first oxidation condition and the second oxidation condition differing from the first oxidation condition each time in performing the cycle the predetermined number of times.

Supplementary Note 4

In the method of Supplementary Note 3, a supply flow rate of the second oxidizing gas supplied under the second oxidation condition may be set to be smaller than a supply flow rate of the first oxidizing gas supplied under the first oxidation condition.

Supplementary Note 5

In the method of Supplementary Note 3 or 4, a concentration of the second oxidizing gas supplied under the second oxidation condition may be set to be lower than a concentration of the first oxidizing gas supplied under the first oxidation condition.

Supplementary Note 6

In the method of any one of Supplementary Notes 3 to 5, a supply time of the second oxidizing gas supplied under the second oxidation condition may be set to be shorter than a supply time of the first oxidizing gas supplied under the first oxidation condition.

Supplementary Note 7

In the method of any one of Supplementary Notes 3 to 6, a pressure of a space in which the substrate exists when supplying the second oxidizing gas under the second oxidation condition may be set to be lower than a pressure of the space in which the substrate exists when supplying the first oxidizing gas under the first oxidation condition.

Supplementary Note 8

In the method of any one of Supplementary Notes 3 to 7, the first oxidizing gas may be different from the second oxidizing gas in material.

For example, oxidation power of the first oxidizing gas may be greater than oxidation power of the second oxidizing gas.

For example, under the first oxidation condition, the first oxidizing gas may be plasma-excited and supplied to the substrate. Under the second oxidation condition, the second oxidizing gas may be supplied to the substrate without being plasma-excited.

For example, under the first oxidation condition, an oxygen-containing gas and a hydrogen-containing gas may be supplied as the oxidizing gas. Under the second oxidation condition, an oxygen-containing gas may be supplied as the oxidizing gas. In this case, the oxygen-containing gas and the hydrogen-containing gas may be allowed to react with each other under the first oxidation condition, thereby generating oxidizing species including atomic oxygen. The oxidizing species including atomic oxygen may be supplied to the substrate.

Supplementary Note 9

In the method of any one of Supplementary Notes 1 to 8, a precursor gas having chemical bonds between the predetermined element and carbon and containing at least one selected from a group consisting of an alkyl group, an alkylene group and an amino group may be used in forming the laminated film.

Supplementary Note 10

In the method of any one of Supplementary Notes 1 to 9, a first precursor gas supplied in forming the first film may be different from a second precursor gas supplied in forming the second film in material. That is to say, in forming the first film, the first precursor gas differing in molecular structure from the second precursor gas supplied in forming the second film may be supplied.

For example, in forming the first film, a carbon-free gas containing the predetermined element may be used as the first precursor gas. In forming the second film, a gas containing the predetermined element and carbon and having chemical bonds between the predetermined element and carbon may be used as the second precursor gas.

For example, in forming the second film, a gas in which the number of chemical bonds between the predetermined element and carbon contained in one molecule (chemical structural formula) of the gas is larger than the number of chemical bonds between the predetermined element and carbon contained in one molecule (chemical structural formula) of the first precursor gas supplied in forming the first film may be used as the second precursor gas.

Supplementary Note 11

In the method of Supplementary Note 1 or 2, forming the first film may include performing a first set a first preset number of times ($m_1$ times), the first set including: supplying a first precursor gas containing the predetermined element to the substrate; and supplying a first oxidizing gas to the substrate. Further, forming the second film may include performing a second set a second preset number of times ($m_2$ times or more), the second set including: supplying a second precursor gas containing the predetermined element and carbon and having chemical bonds between the predetermined element and carbon to the substrate; and supplying a second oxidizing gas to the substrate.

Supplementary Note 12

In the method of any one of Supplementary Notes 1 to 11, each of the first film and the second film may have a thickness ranging from 0.1 nm to 5 nm, specifically 0.1 nm to 3 nm, more specifically 0.1 nm to 1 nm.

Supplementary Note 13

In the method of any one of Supplementary Notes 3 to 12, the number of times of performing each of the first set and the second set may be set at once or more and 50 times or less, specifically once or more and 30 times or less, more specifically once or more and 10 times or less.

Supplementary Note 14

In the method of any one of Supplementary Notes 1 to 13, the laminated film may be a nano-laminated film composed of the first film and the second film alternately laminated at a nano scale thickness.

Supplementary Note 15

In the method of any one of Supplementary Notes 1 to 14, the first film may be formed first in performing the cycle. That is to say, the first film may be formed earlier than the second film. In other words, prior to forming the second film, the first film may be formed as a base for formation of the second film. Then, the second film may be formed on the first film formed earlier. That is to say, the lowermost portion of the laminated film composed of the first film and the second film laminated one above another may be configured by the first film.

Supplementary Note 16

In the method of any one of Supplementary Notes 1 to 15, the first film may be formed last in performing the cycle. That is to say, if the second film is formed at the final cycle, the surface of the second film may be covered with the first film. In other words, the uppermost portion of the laminated film composed of the first film and the second film laminated one above another may be configured by the first film.

Supplementary Note 17

According to another aspect of the present disclosure, there is provided a substrate processing apparatus, including: a process chamber configured to accommodate a substrate; a precursor gas supply system configured to supply a precursor gas containing a predetermined element and carbon and having chemical bonds between the predetermined element and carbon to the substrate in the process chamber; an oxidizing gas supply system configured to supply an oxidizing gas to the substrate in the process chamber; and a control part configured to control the precursor gas supply system and the oxidizing gas supply system so as to perform a process of forming a laminated film on the substrate in the process chamber by performing a cycle a predetermined number of times (n times), the cycle including: forming a first film which contains at least the predetermined element and oxygen; and forming a second film which contains at least the predetermined element, oxygen and carbon, wherein the first film and the second film are laminated to form the laminated film.

Supplementary Note 18

According to a further aspect of the present disclosure, there is provided a program or a non-transitory computer-readable recording medium storing the program, wherein the program is configured to cause a computer to perform a process of forming a laminated film on a substrate by performing a cycle a predetermined number of times (n times), the cycle including: forming a first film which contains at least a predetermined element and oxygen; and forming a second film which contains at least the predetermined element, oxygen and carbon, wherein the first film and the second film are laminated to form the laminated film.

According to the present disclosure in some embodiments, it is possible to form a film which is superior in etching resistance and surface roughness.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a laminated film on a substrate by performing a cycle a predetermined number of times, the cycle comprising:
    forming a first film which contains at least a predetermined element and oxygen by performing a first set a first preset number of times, the first set including non-simultaneously performing:
    supplying a first precursor gas containing the predetermined element and carbon and having chemical bonds between the predetermined element and carbon to the substrate to form a first adsorption layer containing the predetermined element and carbon; and
    supplying a first oxidizing gas to the substrate to oxidize the first adsorption layer and desorb the carbon from the first adsorption layer under a first oxidation condition such that the first film has a first carbon concentration; and
    forming a second film which contains at least the predetermined element, oxygen and carbon by performing a second set a second preset number of times, the second set including non-simultaneously performing:
    supplying a second precursor gas containing the predetermined element and carbon and having chemical bonds between the predetermined element and carbon to the substrate to form a second adsorption layer containing the predetermined element and carbon; and supplying a second oxidizing gas to the substrate to oxidize the second adsorption layer and desorb the carbon from the second adsorption layer under a second oxidation condition and a non-plasma condition, the second oxidation condition being different from the first oxidation condition, such that the second film has a second carbon concentration higher than the first carbon concentration, wherein the first film and the second film are laminated to form the laminated film.

2. The method of claim 1, wherein the first film is a carbon-free film having a carbon concentration of zero.

3. The method of claim 1, wherein a supply flow rate of the second oxidizing gas supplied under the second oxidation condition is set to be smaller than a supply flow rate of the first oxidizing gas supplied under the first oxidation condition.

4. The method of claim 1, wherein a concentration of the second oxidizing gas supplied under the second oxidation condition is set to be lower than a concentration of the first oxidizing gas supplied under the first oxidation condition.

5. The method of claim 1, wherein a supply time of the second oxidizing gas supplied under the second oxidation condition is set to be shorter than a supply time of the first oxidizing gas supplied under the first oxidation condition.

6. The method of claim 1, wherein a pressure of a space in which the substrate exists when supplying the second oxidizing gas under the second oxidation condition is set to be lower than a pressure of the space in which the substrate exists when supplying the first oxidizing gas under the first oxidation condition.

7. The method of claim 1, wherein the first oxidizing gas is different from the second oxidizing gas in material.

8. The method of claim 1, wherein oxidation power of the first oxidizing gas is greater than oxidation power of the second oxidizing gas.

9. The method of claim 1, wherein each of the first precursor gas and the second precursor gas contains at least one selected from a group consisting of an alkyl group, an alkylene group and an amino group.

10. The method of claim 1, wherein the first precursor gas is different from the second precursor gas in material.

11. A method of manufacturing a semiconductor device, comprising forming a laminated film on a substrate by performing a cycle a predetermined number of times, the cycle comprising:

forming a first film which contains at least a predetermined element and oxygen by performing a first set a first preset number of times, the first set including non-simultaneously performing:

supplying a first precursor gas containing the predetermined element to the substrate to form a first adsorption layer containing the predetermined element; and supplying a first oxidizing gas to the substrate to oxidize the first adsorption layer under a first oxidation condition, and forming a second film which contains at least the predetermined element, oxygen and carbon by performing a second set a second preset number of times, the second set including non-simultaneously performing:

supplying a second precursor gas containing the predetermined element and carbon and having chemical bonds between the predetermined element and carbon to the substrate to form a second adsorption layer containing the predetermined element and carbon; and supplying a second oxidizing gas to the substrate to oxidize the second adsorption layer and desorb the carbon from the second adsorption layer under a second oxidation condition and a non-plasma condition, the second oxidation condition being different from the first oxidation condition.

12. The method of claim 1, wherein each of the first film and the second film has a thickness ranging from 0.1 nm to 5 nm.

13. The method of claim 1, wherein the laminated film is a nano-laminated film composed of the first film and the second film alternately laminated at a nano scale thickness.

14. The method of claim 1, wherein the first film is formed first in performing the cycle.

15. The method of claim 1, wherein the first film is formed last in performing the cycle.

16. The method of claim 1, wherein the first film has a carbon concentration of an impurity level.

17. The method of claim 1, wherein the first film has a carbon concentration of substantially zero.

* * * * *